(12) United States Patent
Hidai et al.

(10) Patent No.: US 9,390,069 B2
(45) Date of Patent: Jul. 12, 2016

(54) DATA PROCESSING DEVICE, DATA PROCESSING METHOD, AND PROGRAM

(71) Applicant: Informetis Corporation, Minato-ku, Tokyo (JP)

(72) Inventors: Kenichi Hidai, Tokyo (JP); Kohtaro Sabe, Tokyo (JP); Takashi Hasuo, Tokyo (JP); Naoki Ide, Tokyo (JP)

(73) Assignee: INFORMETIS CORPORATION, Tokyo (JP)

( * ) Notice: Subject to any disclaimer, the term of this patent is extended or adjusted under 35 U.S.C. 154(b) by 0 days.

(21) Appl. No.: 13/912,836

(22) Filed: Jun. 7, 2013

(65) Prior Publication Data

US 2013/0275068 A1    Oct. 17, 2013

Related U.S. Application Data

(63) Continuation of application No. 13/231,591, filed on Sep. 13, 2011, now Pat. No. 8,892,376.

(30) Foreign Application Priority Data

Sep. 16, 2010   (JP) .................................. 2010-208231

(51) Int. Cl.
| | |
|---|---|
| *G06F 17/18* | (2006.01) |
| *G01R 22/10* | (2006.01) |
| *G01R 21/00* | (2006.01) |
| *G06N 7/00* | (2006.01) |
| *G01R 19/25* | (2006.01) |

(52) U.S. Cl.
CPC ............ *G06F 17/18* (2013.01); *G01R 19/2516* (2013.01); *G01R 21/001* (2013.01); *G01R 22/10* (2013.01); *G06N 7/005* (2013.01); *G01R 19/2506* (2013.01)

(58) Field of Classification Search
USPC ................... 702/60, 79, 177–181, 189, 191; 704/239, 240, 241, 256.1, 256.2, 256.4
See application file for complete search history.

(56) References Cited

U.S. PATENT DOCUMENTS

| 4,858,141 A | 8/1989 | Hart et al. | |
|---|---|---|---|
| 6,993,462 B1* | 1/2006 | Pavlovi et al. | ................... 703/2 |
| 7,454,336 B2* | 11/2008 | Attias et al. | ................... 704/240 |
| 7,580,813 B2* | 8/2009 | Thiesson et al. | ................... 703/2 |

(Continued)

FOREIGN PATENT DOCUMENTS

| JP | 2001-330630 | 11/2001 |
|---|---|---|
| JP | 2006-017456 | 1/2006 |
| JP | 2008-039492 | 2/2008 |
| JP | 2009-257952 | 11/2009 |
| WO | 2001-077686 | 10/2001 |

OTHER PUBLICATIONS

Nakamura et al., "Load Monitoring System of Electric Appliances Based on Hidden Markov Model," 1EEJ Transactions on Power and Energy, vol. 126, Issue 12, pp. 1223-1229, Dec. 1, 2008. (7 pages).

(Continued)

*Primary Examiner* — Mohamed Charioui
(74) *Attorney, Agent, or Firm* — K&L Gates LLP

(57) ABSTRACT

A data processing device includes: a data obtaining section obtaining time series data on a total value of current consumed by a plurality of electric apparatuses; and a parameter estimating section obtaining a model parameter when states of operation of the plurality of electric apparatuses are modeled by a factorial HMM on a basis of the obtained time series data.

11 Claims, 18 Drawing Sheets

(56) References Cited

U.S. PATENT DOCUMENTS

| | | | |
|---|---|---|---|
| 2003/0093390 A1 | 5/2003 | Onoda et al. | |
| 2008/0215299 A1* | 9/2008 | Garg et al. | 703/2 |
| 2010/0280978 A1* | 11/2010 | Shimada et al. | 706/12 |
| 2010/0299287 A1* | 11/2010 | Cao et al. | 706/12 |

OTHER PUBLICATIONS

Inagaki et al., "Noniritrusive Appliance Load Monitoring System—Discrete Operating Conditions and Integer Programming." Dec. 20, 2008. (6 pages).

* cited by examiner

NORMAL HMM

Factorial HMM

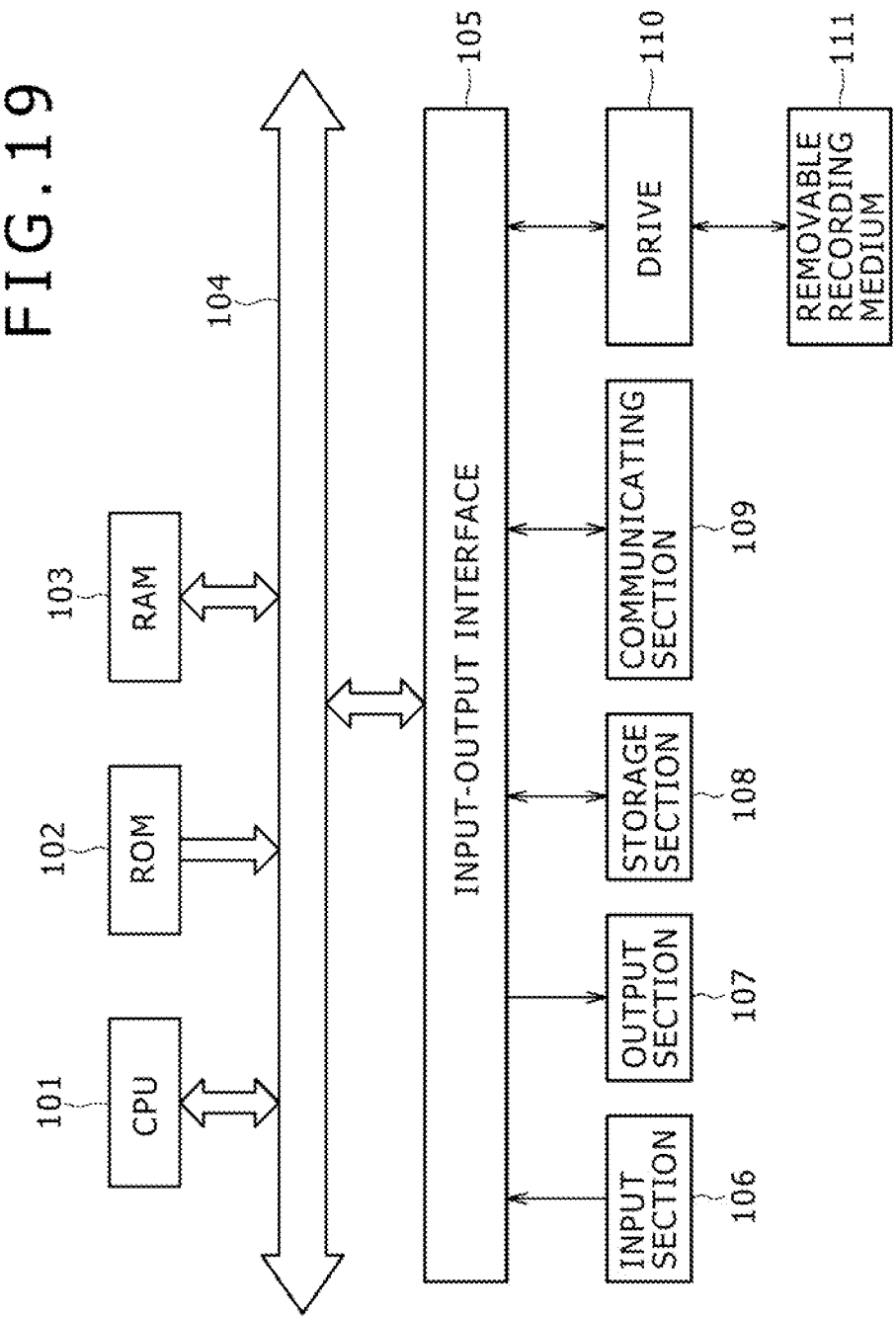

DATA PROCESSING DEVICE, DATA PROCESSING METHOD, AND PROGRAM

CROSS REFERENCES TO RELATED APPLICATIONS

The present application is a continuation of U.S. application Ser. No. 13/231,591, filed on Sep. 13, 2011, which claims priority to Japanese Priority Patent Application JP 2010-208231 filed in the Japan Patent Office on Sep. 16, 2010, the entire content of which is hereby incorporated by reference.

BACKGROUND

The present application relates to a data processing device, a data processing method, and a program, and particularly to a data processing device, a data processing method, and a program that make it possible to establish a method which facilitates the calculation and adjustment of a parameter and which eliminates a need for an advance database in a case of estimating an electric apparatus from current information obtained.

Techniques of estimating an electric apparatus connected beyond a distribution board from information on current measured by the distribution board are referred to as non-intrusive load monitoring (hereinafter referred to as NILM), and have been studied since the 1980s. NILM has great advantages of not requiring a measuring instrument for each of individual electric apparatuses (loads) and being able to grasp the states of all the electric apparatuses connected beyond one point on the basis of only a result of measurement at the one point.

As a representative technique of NILM, U.S. Pat. No. 4,858,141 (hereinafter referred to as Patent Document 1), for example, discloses a technique of identifying an electric apparatus by calculating real power and reactive power from measurements of current and voltage and clustering amounts of change in the real power and the reactive power. The amounts of change are obtained because the real power and the reactive power being measured change when the electric apparatus is turned on and off.

FIG. 1 is a diagram shown as FIG. 8 in Patent Document 1. In FIG. 1, real power and reactive power when a refrigerator and a heater are on and off are plotted on a two-dimensional plane having the real power and the reactive power as axes thereof. FIG. 1 shows that the on and off states of the electric apparatuses are plotted at positions symmetric with respect to a point.

The method of Patent Document 1 obtains difference at the on and off times, and thus uses only information on the moments of changes. In addition, a change point detector (change detector) is necessary, and when the change point detector fails (misses detecting turn-on or turn-off, or excessively makes erroneous detection of changes), an entire process in a subsequent stage fails.

That is, the method of Patent Document 1 has the following problems. First, because difference at on and off times is obtained, only information on the moments of changes is used. Second, it is difficult to adjust a threshold value for change point detection, and when a change point detector (net change detection) fails, an entire process in a subsequent stage fails. Third, while the method of Patent Document 1 was able to be applied because many household electric appliances in the 1980s were simple loads, states of many modern electric apparatuses cannot be classified into an on state and an off state alone, so that the method of Patent Document 1 does not function well.

In order to deal with recent electric apparatuses that consume power in a complex manner, there has arisen a need to perform some complex process also on the side of NILM. As attempts to meet the need, many methods using a discriminative model (discriminant model, classification) have been proposed. There are for example methods disclosed in Japanese Patent Laid-Open No. 2001-330630 and PCT Patent Publication No. WO01/077696 (hereinafter referred to as Patent Documents 2 and 3) as methods using an LMC (Large Margin Classifier) such as a support vector machine or the like for a discriminative model.

A discriminative model such as Adaboost, a support vector machine, or the like is known to exhibit very high discriminating performance when a feature quantity is selected well and there is a sufficiently large amount of sample data for learning. This method may therefore be considered to be effective in improving accuracy. On the other hand, however, in the case of a discriminative model, unlike a generative model such as an HMM or the like, it is necessary to prepare learning data in advance and complete learning, and it is further necessary to retain results of the learning as a database. That is, there is a disadvantage in that unknown electric apparatuses cannot be handled.

There are techniques for making discrimination by a simple linear model as in Japanese Patent Laid-Open No. 2008-039492 (hereinafter referred to as Patent Document 4) and Shinkichi Inagaki, Tsukasa Egami, Tatsuya Suzuki, Hisahide Nakamura, and Koichi Ito, "Non-Intrusive Type Operation State Monitoring System for Electric Apparatuses—Solution Based on Integer Programming with Attention Directed to Discrete States of Operation—," Proceedings of 42th Workshop on Discrete Event Systems, The Society of Instrument and Control Engineers, pp. 33-38, 2007 (hereinafter referred to as Non-Patent Document 1). However, the techniques have the same problems as the techniques disclosed in Patent Documents 2 and 3 in that an advance database is necessary. Other methods using a database prepared in advance include methods proposed as Japanese Patent Laid-Open Nos. 2006-017456 and 2009-257952 (hereinafter referred to as Patent Documents 5 and 6).

After all, the above-described methods in the past involve a tradeoff between accuracy and a method not requiring advance registration. Household electric apparatuses have recently been greatly diversified, and a discriminative model that needs advance learning is considered to be effectively unfit for household use. A method not requiring advance registration is therefore more desirable.

Accordingly, attempts to use a generative model rather than a discriminative model that needs advance learning have already been made. For example, techniques in which a hidden Markov model (HMM) is applied as a generative model have been proposed (see Bons M., Deville Y., Schang D. 1994. Non-intrusive electrical load monitoring using Hidden Markov Models. Third International Energy Efficiency and DSM Conference, October 31, Vancouver, Canada. p. 7 (Non-Patent Document 2) and Hisahide Nakamura, Koichi Ito, and Tatsuya Suzuki, "Electric Apparatus Operation Condition Monitoring System Based on Hidden Markov Model," IEEJ Transactions on Power and Energy, Vol. 126, No. 12, pp. 1223-1229, 2006 (Non-Patent Document 3), for example).

However, in a case where a simple HMM is applied as a generative model, the number of states explodes (becomes enormous) as the number of electric apparatuses is increased, and a practical system cannot be constructed. For example, supposing that each electric apparatus has two on and off states, and that the number of electric apparatuses is n, a necessary number of states is 2n. Further, the size of state transition probability is the square of 2n (2n)2. Supposing that there are 20 electric apparatuses in total in an ordinary household (which are by no means a large number in recent years), a necessary number of states is 220=1,048,576, and the size of state transition probability is 1,099,511,627,776. This size is on the order of one terabit, and is difficult to be handled even by personal computers in recent years.

Incidentally, the method of Patent Document 1 is also based on clustering, and can be considered to be a primitive generative model, so that advance registration is not necessary. A method for solving a problem without modeling in an era before an approach based on a stochastic model became common, such as the method of Patent Document 1, is referred to as a heuristic method. A heuristic method may be useful as a first step, but has problems in that parameters such as a threshold value and the like increase rapidly as the method is extended, and in that it becomes difficult to adjust the parameters.

An automatic recognition technology using computers has recently become able to solve various difficult problems as a result of the introduction of a stochastic model. When modeling can be performed well by a stochastic model, most parameters can be obtained by maximum likelihood estimation (ML estimation, Maximum Likelihood), posterior probability maximization (MAP estimation, Maximum A Posteriori), a minimum classification error (MCE), and the like. The use of a discriminative model such as a support vector machine or the like and a generative model such as an HMM or the like corresponds to modeling by a stochastic model.

SUMMARY

From the above, an NILM method solving the following three points is desired. First, there is a desire to solve the problem of difficulty in parameter adjustment such as the problem of a heuristic method, that is, the ease of parameter adjustment is desired. Second, there is a desire to eliminate a need for an advance database because it is difficult to handle new electric apparatuses that have recently increased in number when an advance database is necessary as in the case of a discriminative model. Third, because a parameter estimating algorithm in which the number of states explodes cannot practically provide a solution, the number of states needs to be a practical number that makes parameter calculation possible.

The present application has been made in view of such a situation. It is desirable to establish a method which facilitates the calculation and adjustment of a parameter and which eliminates a need for an advance database in a case of estimating an electric apparatus from current information obtained.

According to an embodiment, there is provided a data processing device including: a data obtaining section obtaining time series data on a total value of current consumed by a plurality of electric apparatuses; and a parameter estimating section obtaining a model parameter when states of operation of the plurality of electric apparatuses are modeled by a factorial HMM on a basis of the obtained time series data.

According to an embodiment, there is provided a data processing method of a data processing device, the data processing device including a data obtaining section obtaining time series data and a parameter estimating section obtaining a model parameter when modeling is performed by a factorial HMM on a basis of the obtained time series data, the data processing method including: obtaining time series data on a total value of current consumed by a plurality of electric apparatuses; and obtaining a model parameter when states of operation of the plurality of electric apparatuses are modeled by a factorial HMM on a basis of the obtained time series data.

According to an embodiment, there is provided a program for making a computer function as: a data obtaining section obtaining time series data on a total value of current consumed by a plurality of electric apparatuses; and a parameter estimating section obtaining a model parameter when states of operation of the plurality of electric apparatuses are modeled by a factorial HMM on a basis of the obtained time series data.

In an embodiment, time series data on a total value of current consumed by a plurality of electric apparatuses is obtained, and a model parameter when states of operation of the plurality of electric apparatuses are modeled by a factorial HMM is obtained on a basis of the obtained time series data.

According to an embodiment, it is possible to establish a method which facilitates the calculation and adjustment of a parameter and which eliminates a need for an advance database in a case of estimating an electric apparatus from current information obtained.

Additional features and advantages are described herein, and will be apparent from the following Detailed Description and the figures.

BRIEF DESCRIPTION OF THE FIGURES

FIG. 19 is a block diagram showing an example of configuration of an embodiment of a computer to which the present technology is applied.

DETAILED DESCRIPTION

Embodiments of the present application will be described below in detail with reference to the drawings.

An outline of an electric apparatus estimating device as a data processing device to which the present technology is applied will first be described with reference to FIG. 2.

In a house or the like, electricity supplied from an electric power company is first drawn into a distribution board 11, and then supplied from the distribution board 11 to electric apparatus 12 installed in places within the house. For example, in the example of FIG. 2, electricity is supplied from the distribution board 11 to a lighting device (light bulb) 12-1, an air conditioner 12-2, a washing machine 12-3, a refrigerator 12-4, and a television receiver 12-5 as the electric apparatus 12.

The electric apparatus estimating device 1 to which the present technology is applied estimates the states of operation of the plurality of electric apparatuses 12 by measuring a total value of current consumed in a combination of states of use of the plurality of electric apparatuses 12 installed in the respective places within the house on a secondary side of a main breaker of the distribution board 11. On the basis of a result of the estimation, the electric apparatus estimating device 1 displays the present state of operation of each piece of electric apparatus 12, and predicts the states of operation of the electric apparatus 12 in the future after passage of a predetermined time from a present time.

Factorial HMM

The electric apparatus estimating device 1 estimates the state of operation of each piece of electric apparatus 12 using a factorial HMM (Hidden Markov Model) as analyzing means of NILM. In other words, the electric apparatus estimating device 1 obtains a model parameter when the state of operation of each piece of electric apparatus 12 is modeled by the factorial HMM.

Figure 3A:
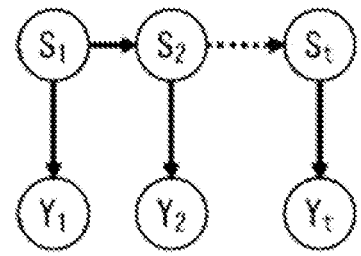
FIGS. 3A and 3B are diagrams of assistance in explaining difference between a normal HMM and a factorial HMM.
Figure 3B:
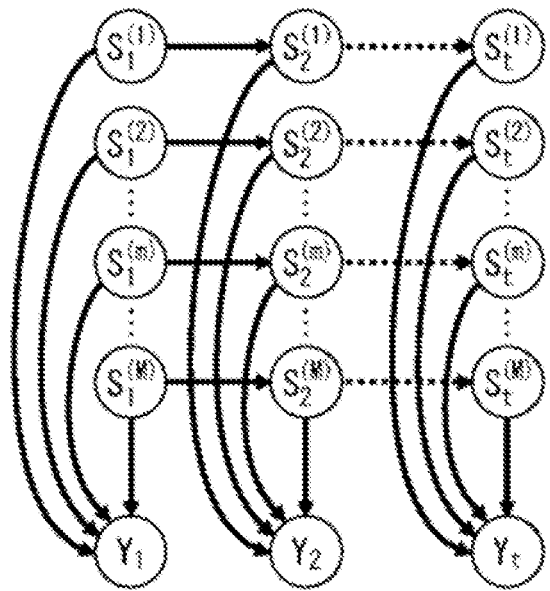

Accordingly, the factorial HMM will first be described in brief. FIGS. 3A and 3B are diagrams representing a normal HMM and a factorial HMM by graphical models.

FIG. 3A is a graphical model representing a normal HMM. FIG. 3B is a graphical model representing a factorial HMM.

In the normal HMM, one state variable $S_t$ corresponds to observation data $Y_t$ at time t. The factorial HMM is different from the normal HMM in that there are a plurality of state variables $S_t$, that is, $S_t^{(1)}, S_t^{(2)}, S_t^{(3)}, \ldots, S_t^{(m)}, \ldots, S_t^{(m)}$ (M state variables in FIG. 3B), and in that one piece of observation data $Y_t$ is generated from the plurality of state variables $S_t^{(1)}$ to $S_t^{(m)}$.

Figure 1:
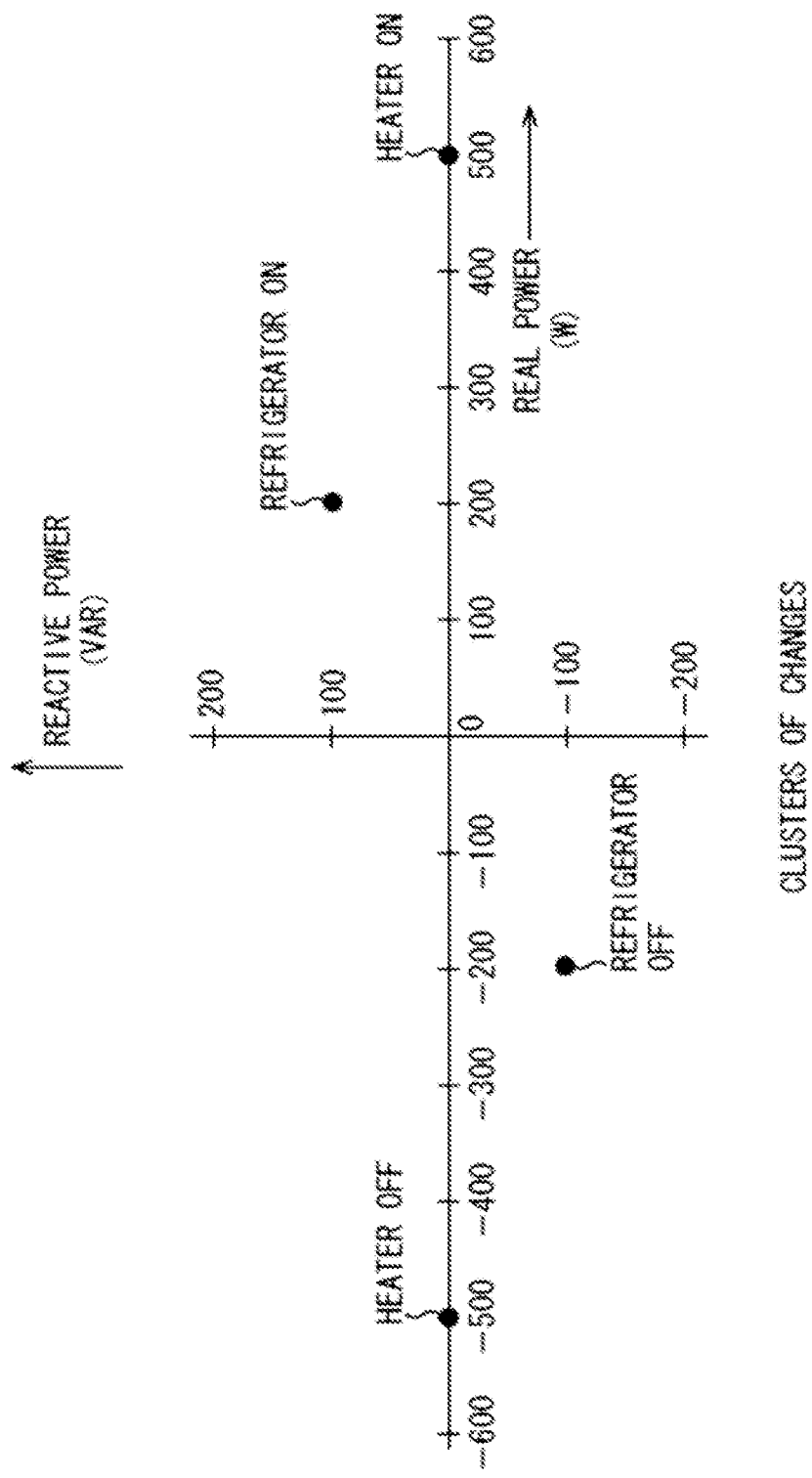
FIG. 1 is a diagram of assistance in explaining a method of Patent Document 1 in the past.
Figure 2:
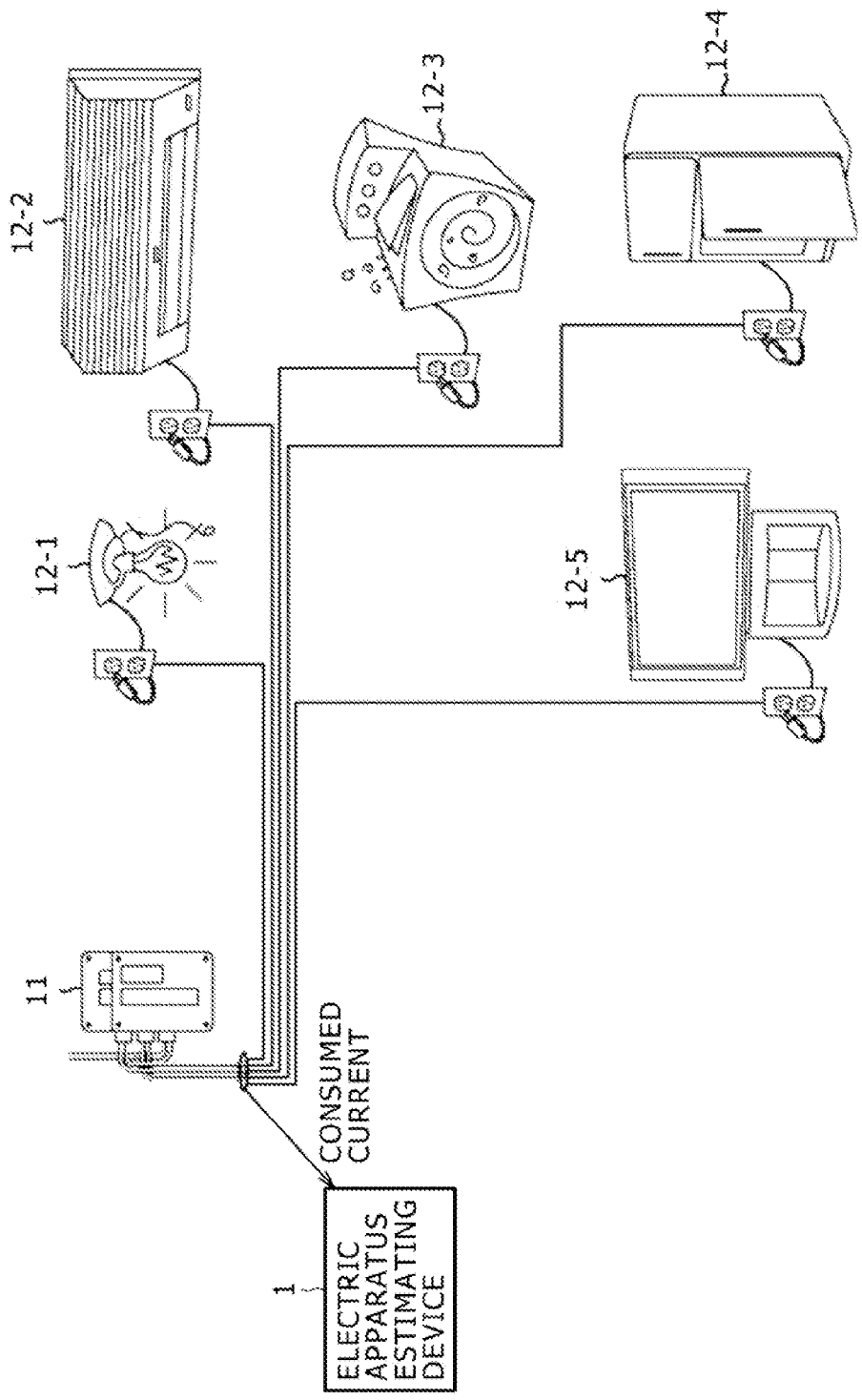
FIG. 2 is a diagram of assistance in explaining an outline of an electric apparatus estimating device as a data processing device to which the present technology is applied.
Figure 4:
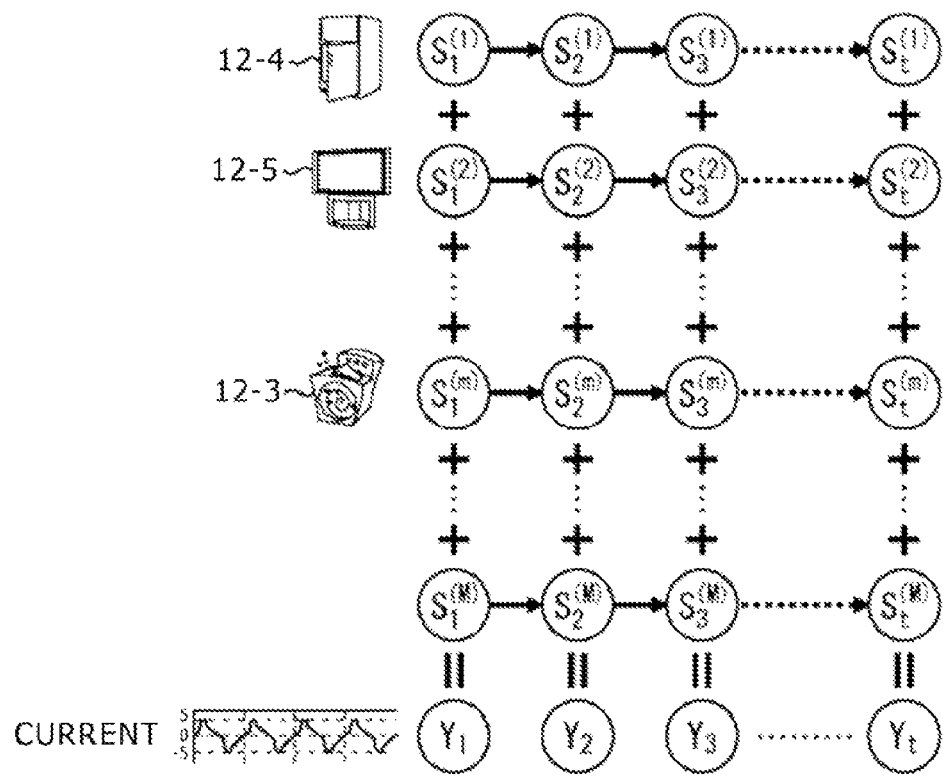
FIG. 4 is a diagram showing correspondence between the factorial HMM and each electric apparatus in FIG. 2.

FIG. 4 is a diagram showing the factorial HMM in FIG. 3B in association with each piece of electric apparatus 12 shown in FIG. 2.

The M state variables $S^{(1)}$ to $S^{(M)}$ of the factorial HMM correspond to respective electric apparatuses 12. In addition, the state value of a state variable $S^{(m)}$ corresponds to the state of the electric apparatus 12 (for example two on and off states).

More specifically, state values $S_1^{(1)}$ to $S_t^{(1)}$ according to the passage of time of the first state variable $S^{(1)}$ of the M state variables $S^{(1)}$ to $S^{(M)}$ correspond to states of a predetermined electric apparatus 12 (for example the refrigerator 12-4). In addition, state values $S_1^{(2)}$ to $S_t^{(2)}$ according to the passage of time of the second state variable $S^{(2)}$ correspond to states of a predetermined electric apparatus 12 (for example the television receiver 12-5). Similarly, state values $S_1^{(m)}$ to $S_t^{(m)}$ according to the passage of time of the mth state variable $S^{(m)}$ correspond to states of a predetermined electric apparatus 12 (for example the washing machine 12-3).

In addition, total values of current consumed in a combination of states of use of the plurality of electric apparatuses 12 installed in the respective places within the house are obtained as observation data $Y_1$ to $Y_t$.

Incidentally, the mth state variable $S^{(m)}$ of the M state variables $S^{(1)}$ to $S^{(M)}$ will hereinafter be described also as an mth factor or a factor m.

Details of the factorial HMM are described in Zoubin Ghahramani, and Michael I. Jordan, "Factorial Hidden Markov Models'," Machine Learning Volume 29, Issue 2-3, November/December 1997 (hereinafter referred to as Document X).

Example of Configuration of Electric Apparatus Estimating Device 1

Figure 5:
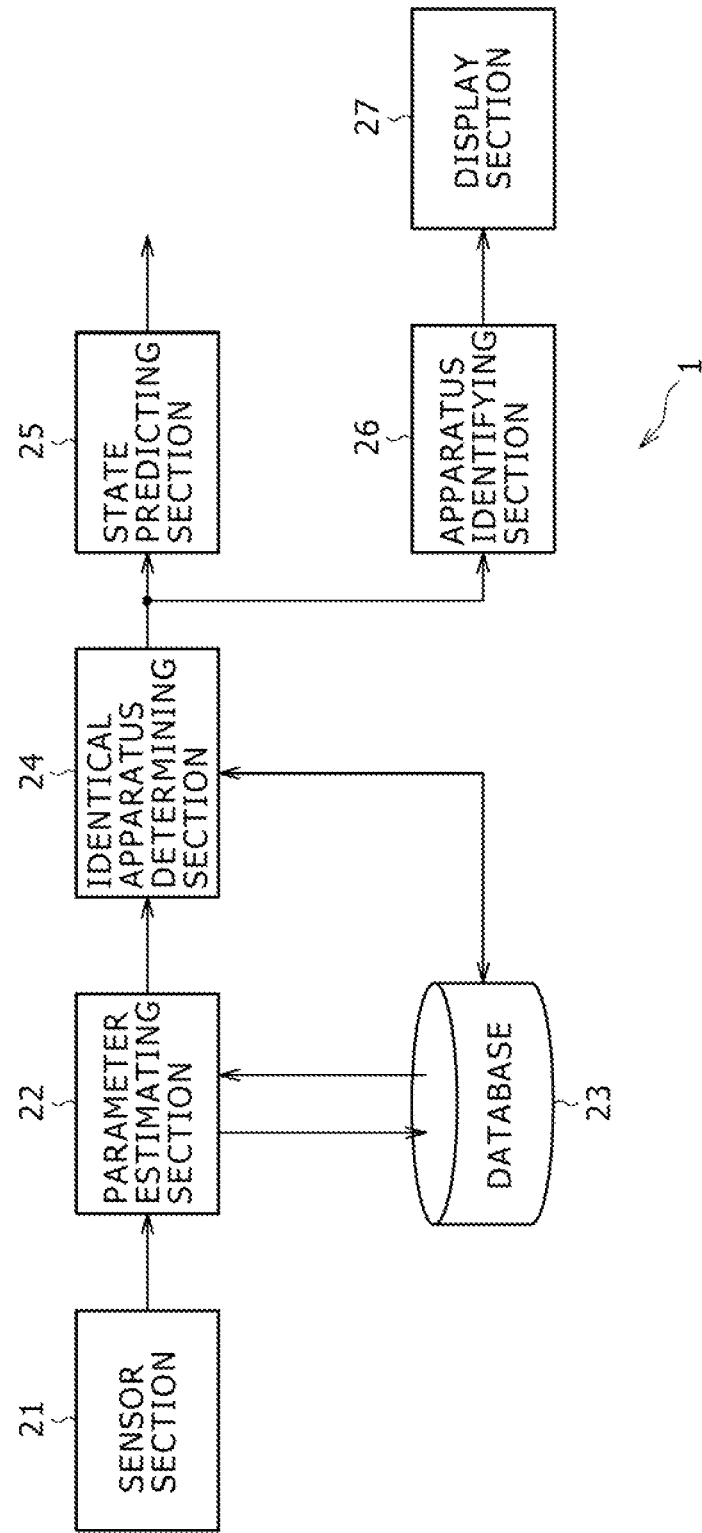
FIG. 5 is a block diagram showing an example of configuration of the electric apparatus estimating device in FIG. 2.

FIG. 5 is a block diagram showing an example of configuration of the electric apparatus estimating device 1.

The electric apparatus estimating device 1 includes a sensor section 21, a parameter estimating section 22, a database 23, an identical apparatus determining section 24, a state predicting section 25, an apparatus identifying section 26, and a display section 27.

The sensor section 21 measures (obtains) a total value of current consumed in a combination of states of use of the plurality of electric apparatuses 12 installed in the respective places within the house as observation data $Y_t$ (t=1, 2, ..., T). The sensor section 21 supplies the observation data to the parameter estimating section 22.

The parameter estimating section 22 obtains a model parameter when the state of operation of each piece of electric apparatus 12 is modeled by the factorial HMM on the basis of the observation data $\{Y_1, Y_2, Y_3, \ldots, Y_t, \ldots, Y_T\}$ as time series data on the total value of current consumed by the plurality of electric apparatuses 12. The model parameter obtained by the learning process of the factorial HMM is stored in the database 23.

In addition, when new observation data $Y_t$ is supplied from the sensor section 21, the parameter estimating section 22 obtains the model parameter from the database 23, and updates the model parameter. That is, the present model parameter is updated on the basis of the new observation data $Y_t$.

The identical apparatus determining section 24 detects a plurality of factors modeling an identical electric apparatus 12 among the M factors, and stores a result of the detection in the database 23. In other words, the identical apparatus determining section 24 determines whether a first factor $m_1$ and a second factor $m_2$ ($m_1 \neq m_2$) among the M factors represent an identical electric apparatus 12, and registers a result of the determination in the database 23.

The factorial HMM itself is a general-purpose method for modeling time series data, and is applicable to various problems other than NILM. Thus, an estimating method using a factorial HMM in the past cannot be applied well to NILM as it is. One of problems of the estimating method using a factorial HMM in the past as it is a case where one electric apparatus 12 may be modeled by a plurality of factors. Accordingly, when one electric apparatus 12 is represented by a plurality of factors, the identical apparatus determining section 24 detects that the plurality of factors correspond to the identical electric apparatus 12.

The state predicting section 25 predicts the state of the factor m (electric apparatus 12 of the factor m) in the future after passage of a predetermined time from a present time using the model parameter stored in the database 23. The factorial HMM is of course a probabilistic model based on an HMM, and is thus able to predict state probability at a future time probabilistically. The state predicting section 25 outputs a result of the prediction of the state of the factor m in the future after the passage of the predetermined time from the present time to a related apparatus controlling section or the like not shown in FIG. 5, for example. The related apparatus controlling section can thereby control another electric apparatus 12 related to the electric apparatus 12 of the factor m on the basis of the result of the prediction of the state of the factor m (electric apparatus 12 of the factor m) in the future.

The apparatus identifying section 26 identifies the electric apparatus 12 to which the factor m corresponds. That is, in a process up to the state predicting section 25, state changes of each factor m can be recognized and predicted, but the electric apparatus 12 to which each factor m corresponds, the electric apparatus 12 being installed in the corresponding place within the house, cannot be identified. The apparatus identifying section 26 associates each factor m with an electric apparatus 12 within the house. For example, the apparatus identifying section 26 stores a current waveform pattern typical of each product type (the washing machine, the refrigerator, the air conditioner, and the like) of electric apparatus 12, compares the typical current waveform pattern with actually obtained observation data Y of factors, and identifies the electric apparatus 12 (type of the electric apparatus 12). In addition, for example, the apparatus identifying section 26 receives an input of a type of electric apparatus 12 which input is provided for each factor by a user on an operating section not shown in FIG. 5, and associates the input type (product) of the electric apparatus 12 with the observation data Y of the factors.

The display section 27 is formed by a liquid crystal display or the like. The display section 27 displays the state of operation of the electric apparatus 12 identified by the apparatus identifying section 26 on the basis of a result of estimation by the parameter estimating section 22.

Details of each of the parts forming the electric apparatus estimating device 1 will be described in the following.

Example of Detailed Configuration of Sensor Section 21

Figure 6:
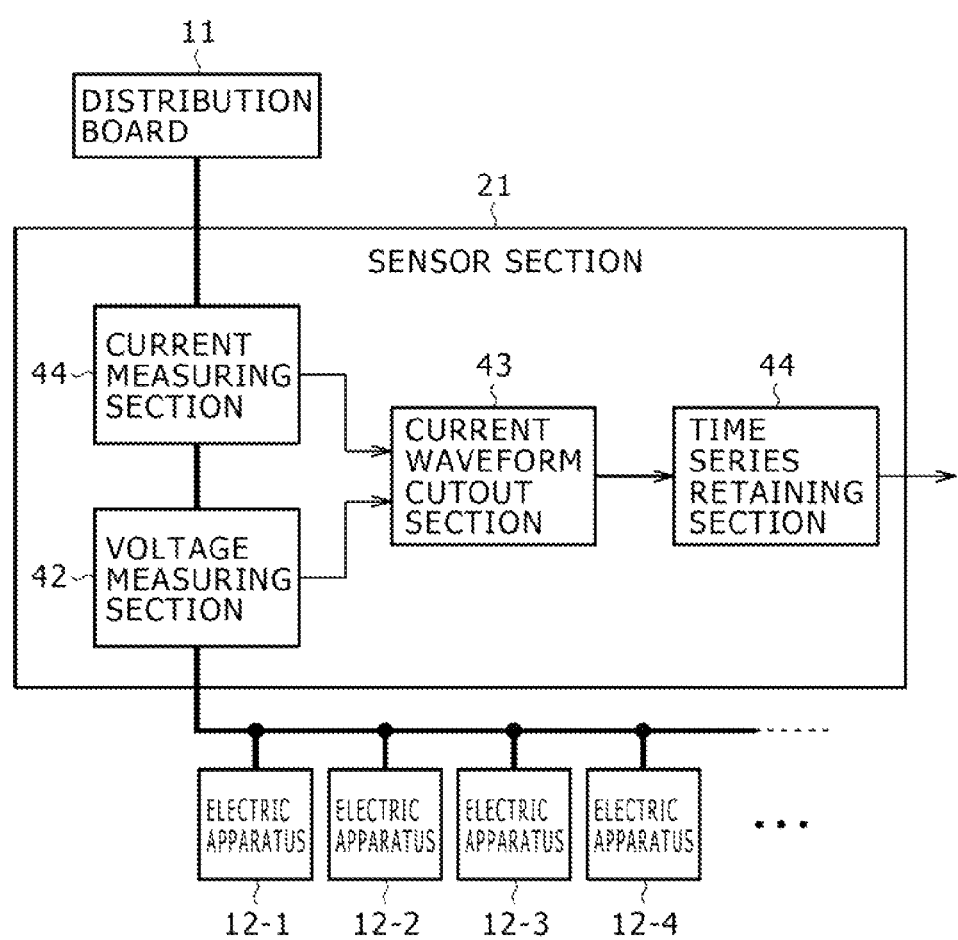
FIG. 6 is a block diagram showing an example of detailed configuration of a sensor section.

FIG. 6 is a block diagram showing an example of detailed configuration of the sensor section 21.

The sensor section 21 includes a current measuring section 41 and a voltage measuring section 42 for measuring total values of current and voltage of the plurality of electric apparatuses 12 installed in the respective places within the house, a current waveform cutout section 43, and a time series retaining section 44.

Figure 7:
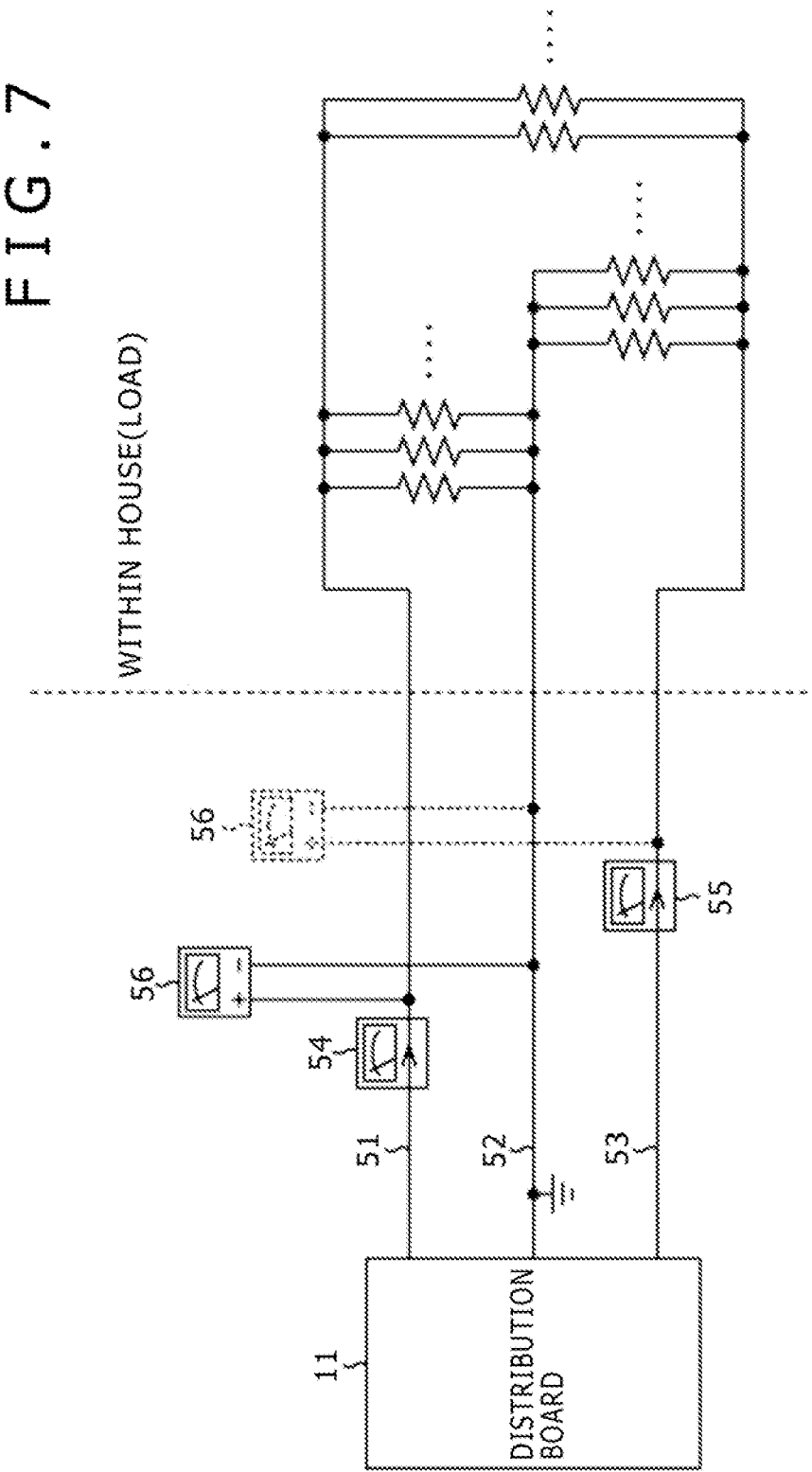
FIG. 7 is a diagram showing an example of a current measuring section and a voltage measuring section.

FIG. 7 shows an example of the current measuring section 41 and the voltage measuring section 42 in a case where electricity is supplied to the plurality of electric apparatuses 12 by wiring of a single-phase three-wire system.

For example, the current measuring section 41 is formed by two clamp-on ammeters 54 and 55, which are clamped to two voltage lines (cables) 51 and 53 connected to the secondary side of the main ampere breaker within the distribution board 11, and measures a current flowing through the voltage lines.

The voltage measuring section 42 is formed by a voltmeter 56, and measures a voltage between predetermined lines. The voltage is measured to synchronize the phase of the current with the phase of the voltage. It therefore suffices for the voltage measuring section 42 to measure one of a voltage between the voltage line 51 and a neutral line 52 and a voltage between the neutral line 52 and the voltage line 53. In the example of FIG. 7, the voltmeter 56 measures the voltage between the voltage line 51 and the neutral line 52.

Returning to FIG. 6, the current waveform cutout section 43 generates a representative sample by discretely reducing the time series data (current waveform) of current values obtained momently in a temporal direction, and supplies the representative sample as observation data $Y_t$ at time t to the time series retaining section 44.

Figure 8:
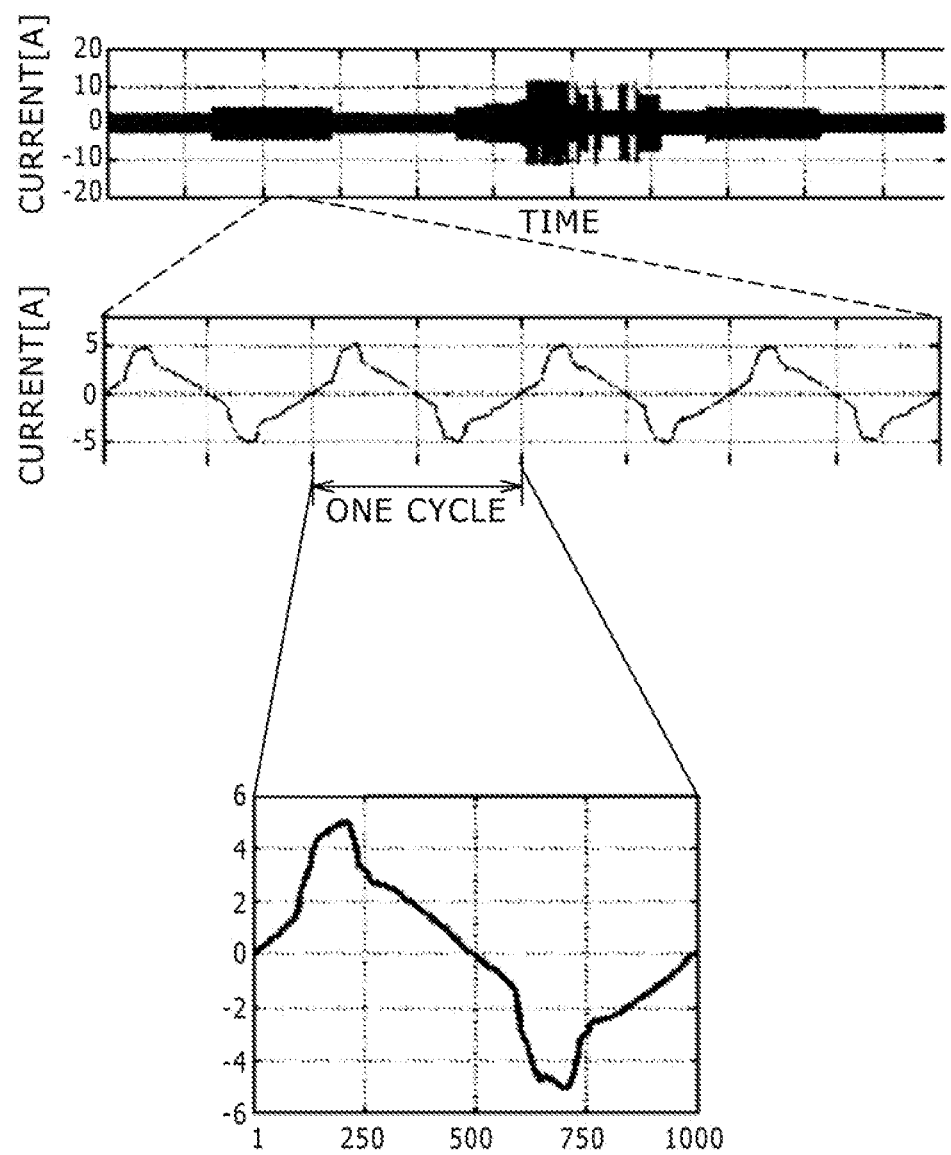
FIG. 8 is a diagram showing an example of time series data of current values measured by the current measuring section.

FIG. 8 shows an example of the time series data of current values measured by the current measuring section 41.

A waveform in the top of FIG. 8 is the time series data of current values measured by the current measuring section 41 within a predetermined period. The magnitude of amplitude of the waveform represents the magnitude of consumed current.

A waveform in the middle of FIG. 8 represents time series data of four cycles which time series data is included in the time series data shown in the top of FIG. 8 in an enlarged manner. Further, a waveform in the bottom of FIG. 8 represents time series data of one cycle which time series data is included in the time series data of four cycles in the middle of FIG. 8 in an enlarged manner.

The current waveform cutout section 43 first synchronizes the phase of the current waveform with the phase of the voltage. Specifically, the current waveform cutout section 43 treats a moment of zero crossing of the voltage value as a phase zero of the current waveform. The current waveform cutout section 43 next samples the current waveform for one cycle at predetermined time intervals. This is because sampling all cycles would result in a massive amount of data. When the current waveform of one cycle is obtained as one sample in the period of one second, for example, an amount of data can be reduced to 1/50 in a region of a commercial power frequency of 50 Hz.

When one time of sampling is performed at 50 Hz, that is, the current waveform of one cycle is sampled at 50 Hz in the region of a commercial power frequency of 50 Hz, 1000 current values are obtained by one time of sampling, as shown in the bottom of FIG. 8. The current waveform cutout section 43 expresses the 1000 current values obtained by one time of sampling by a 1000-dimensional current value vector, and supplies the 1000-dimensional current value vector as observation data $Y_t$ at present time t to the time series retaining section 44. The observation data $Y_t$ is thus a D-dimensional (D=1000) real vector.

Returning to FIG. 6, the time series retaining section 44 stores and retains the observation data $Y_t$ sequentially supplied from the current waveform cutout section 43. Thereby, observation data $\{Y_1, Y_2, Y_3, \ldots, Y_t, \ldots, Y_T\}$ one sample of which is expressed by a 1000-dimensional current value vector is stored in the time series retaining section 44.

Incidentally, while the observation data is discretely reduced in the temporal direction by simply performing one time of sampling in the period of one second in the above-described example, a method of discretely reducing the observation data is not limited to this. For example, an average vector of current value vectors of 50 samples may be calculated, and a result of the calculation may be set as the observation data $Y_t$ of one sample. In addition, a current value vector closest to an average vector of 50 samples among the current value vectors of the 50 samples may be set as the observation data $Y_t$ of one sample. Alternatively, the current value vectors of 50 samples may be clustered by a K-means method and an average vector of a cluster of a largest number of samples may be set as the observation data $Y_t$ of one sample, or an average vector of two samples with a minimum distance between the vectors among the current value vectors of 50 samples may be set as the observation data $Y_t$ of one sample.

On the basis of the observation data $\{Y_1, Y_2, Y_3, \ldots, Y_t, \ldots, Y_T\}$ stored in the time series retaining section 44, the parameter estimating section 22 estimates the model parameter of the factorial HMM when the states of operation of the plurality of electric apparatuses 12 are modeled.

Factorial HMM

Details of the parameter estimating section 22 will next be described. However, model parameter estimation in the factorial HMM will first be described.

Supposing that hidden states for the observation data $\{Y_1, Y_2, Y_3, \ldots, Y_t, \ldots, Y_T\}$ are $\{S_1, S_2, S_3, \ldots, S_t, \ldots, S_T\}$, the joint probability of a hidden state $S_t$ and observation data $Y_t$ is given by the following Equation (1).

$$P(\{S_t, Y_t\}) = P(S_1)P(Y_1 \mid S_1)\prod_{t=2}^{T} P(S_t \mid S_{t-1})P(Y_t \mid S_t) \tag{1}$$

$P(S_1)$ in Equation (1) denotes initial probability, $P(S_t|S_{t-1})$ in Equation (1) denotes state transition probability, and $P(Y_t|S_t)$ in Equation (1) denotes observation probability. $P(S_1)$, $P(S_t|S_{t-1})$, and $P(Y_t|S_t)$ in Equation (1) are calculated by Equation (2), Equation (3), and Equation (4), respectively.

$$P(S_1) = \prod_{m=1}^{M} P(S_1^{(m)}) \tag{2}$$
$$= \prod_{m=1}^{M} \pi^{(m)}$$

$$P(S_t \mid S_{t-1}) = \prod_{m=1}^{M} P(S_t^{(m)} \mid S_{t-1}^{(m)}) \tag{3}$$
$$= \prod_{m=1}^{M} A^{(m)}$$

$$P(Y_t \mid S_t) = \text{Normal}(Y_t : \mu_t, C) \tag{4}$$
$$= \frac{1}{\sqrt{(2\pi)^D |C|}} \exp\left(-\frac{1}{2}(Y_t - \mu_t)' C^{-1}(Y_t - \mu_t)\right) \text{ where}$$

$$\mu_t = \sum_{m=1}^{M} W^{(m)} S_t^{(m)}$$

Although there is a case where a plurality of factors correspond to one electric apparatus 12, model parameter estimation in the factorial HMM will be described supposing that one factor corresponds to one electric apparatus 12 as a simplest example. An electric apparatus 12 corresponding to a factor m in the case where one factor corresponds to one electric apparatus 12 will be referred to also as an mth electric apparatus 12.

$S_t^{(m)}$ in Equations (2) to (4) denotes the state (an on state, an off state, a strong operation, and a weak operation or the like) of the mth electric apparatus 12 at time t. Letting K be the number of states of the mth electric apparatus 12, $S_t^{(m)}$ is formed by a K-dimensional vertical vector (vector of K rows and one column).

The initial probability $P(S_1)$ in Equation (2) is calculated by multiplication of M pieces of $\pi^{(m)}$. $\pi^{(m)}$ denotes the initial state probability of the mth electric apparatus 12, and is a vertical vector of K dimensions.

The state transition probability $P(S_t|S_{t-1})$ in Equation (3) is calculated by multiplication of M pieces of $A^{(m)}$. $A^{(m)}$ for example denotes the state transition probability of the mth electric apparatus 12 which state transition probability corresponds to a tendency to change from an on state to an off state, and is formed by a square matrix of K rows and K columns (K×K).

The observation probability $P(Y_t|S_t)$ in Equation (4) is calculated by a multivariate normal distribution with an observation average $\mu_t$ and a covariance matrix C. In Equation (4), a dash (') denotes transposition, and "−1" at an upper right denotes a reciprocal. In addition, $|C|$ denotes the absolute value of C.

$W^{(m)}$ in Equation (4) is a parameter of the observation probability $P(Y_t|S_t)$ which parameter corresponds to the pattern of a current waveform consumed by the mth electric apparatus 12. Because the pattern of the current waveform differs for each state of the electric apparatus 12, $W^{(m)}$ is a matrix of D rows and K columns (D×K) with the number D of dimensions of observation data as the number of rows and with the number K of states as the number of columns.

$\mu_t$ denotes an observation average at time t, and is obtained by adding together M column elements of the matrix $W^{(m)}$ which column elements correspond to the state $S_t^{(m)}$. In other words, $\mu_t$ corresponds to an addition of current values corresponding to the states of all the electric apparatuses 12. Thus, when the observation average $\mu_t$ is close to observation data $Y_t$ at time t, the model parameter is plausible. The covariance matrix C corresponds to the intensity of noise superimposed on a current pattern, and is assumed to be common to all the electric apparatuses 12 at all times.

Figure 9:
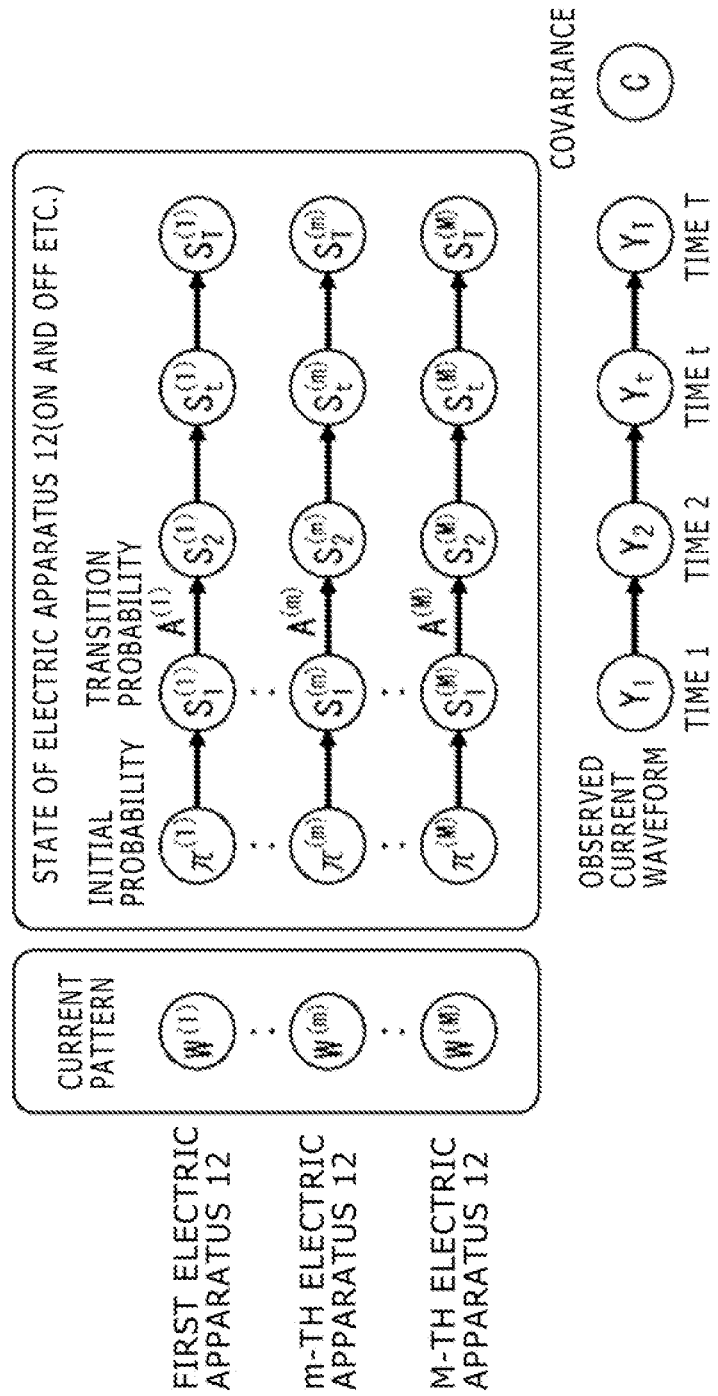
FIG. 9 is a diagram showing correspondences between a model parameter of the factorial HMM and events in NILM.

From the above, the model parameter estimation in the factorial HMM by the parameter estimating section 22 is specifically to obtain the initial state probability $\pi^{(m)}$ of the mth electric apparatus 12, the state transition probability $A^{(m)}$ of the mth electric apparatus 12, the observation probability parameter $W^{(m)}$ of the mth electric apparatus 12, and the covariance matrix C. FIG. 9 shows correspondences between the model parameter $\Phi = \{\pi^{(m)}, A^{(m)}, W^{(m)}, C\}$ of the factorial HMM and events in NILM.

The above-described Document X discloses four estimating methods as methods for estimating the model parameter $\Phi = \{\pi^{(m)}, A^{(m)}, W^{(m)}, C\}$. Specifically, Document X discloses 1) exact inference, 2) inference using Gibbs sampling, 3) completely factorized variational inference, and 4) structured variational inference.

The four estimating methods are each a method using an EM algorithm, and can be adopted as a basis for an estimation process performed by the parameter estimating section 22. "1) exact inference" involves a large amount of calculation but enables stable estimation with high accuracy, and is thus useful when used for a small-scale system having a small number of electric apparatuses 12 or in a development stage. "4) structured variational inference" is most effective when considered comprehensively in relation to each of execution speed, an amount of memory used at a time of execution, and execution accuracy.

Description in the following will be made supposing that the parameter estimating section 22 performs "3) completely factorized variational inference" and "4) structured variational inference" among the four estimating methods.

Parameter Estimating Process by Completely Factorized Variational Method

Figure 10:
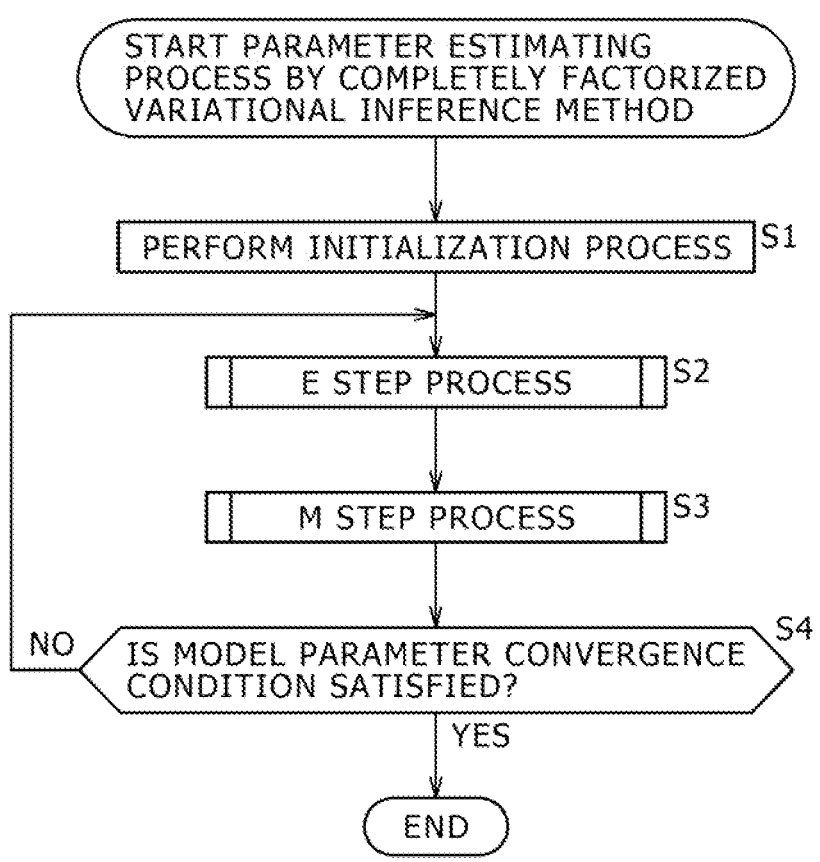
FIG. 10 is a flowchart of assistance in explaining a parameter estimating process by a completely factorized variational method.

FIG. 10 is a flowchart of a parameter estimating process by a completely factorized variational method, which is "3) completely factorized variational inference."

First, in step S1, the parameter estimating section 22 performs an initializing process for initializing working variables and the like in the parameter estimating process. Specifically, for all times t and factors m (t=1, ..., T, m=1, ..., M), the parameter estimating section 22 initializes a variational parameter $\theta_t^{(m)}$, the observation probability parameter $W^{(m)}$ of the factor m, a covariance matrix C, and state transition probability $A_{i,j}^{(m)}$. The variational parameter $\theta^{(m)}$ and the state transition probability $A_{i,j}^{(m)}$ are assigned 1/K as an initial value. The observation probability parameter $W^{(m)}$ of the factor m is assigned a predetermined random number as an initial value. C=aI (a is an arbitrary real number and I is a unit matrix of D rows and D columns (D×D)) is set as an initial value for the covariance matrix C.

In step S2, the parameter estimating section 22 performs an E step process for estimating state probability. Details of the E step process will be described later with reference to FIG. 11.

In step S3, the parameter estimating section 22 performs an M step process for estimating a transition and an observation parameter. Details of the M step process will be described later with reference to FIG. 12.

In step S4, the parameter estimating section 22 determines whether a model parameter convergence condition is satisfied. For example, the parameter estimating section 22 determines that the model parameter convergence condition is satisfied when the number of repetitions of the process of steps S2 to S4 has reached a predetermined number of times set in advance, or when an amount of change in state likelihood due to update of the model parameter is within a predetermined value.

When it is determined in step S4 that the model parameter convergence condition is not satisfied yet, the process returns to step S2 to repeat the process of steps S2 to S4.

When it is determined in step S4 that the model parameter convergence condition is satisfied, on the other hand, the parameter estimating section 22 ends the parameter estimating process.

Detailed Flowchart of E Step Process

Figure 11:
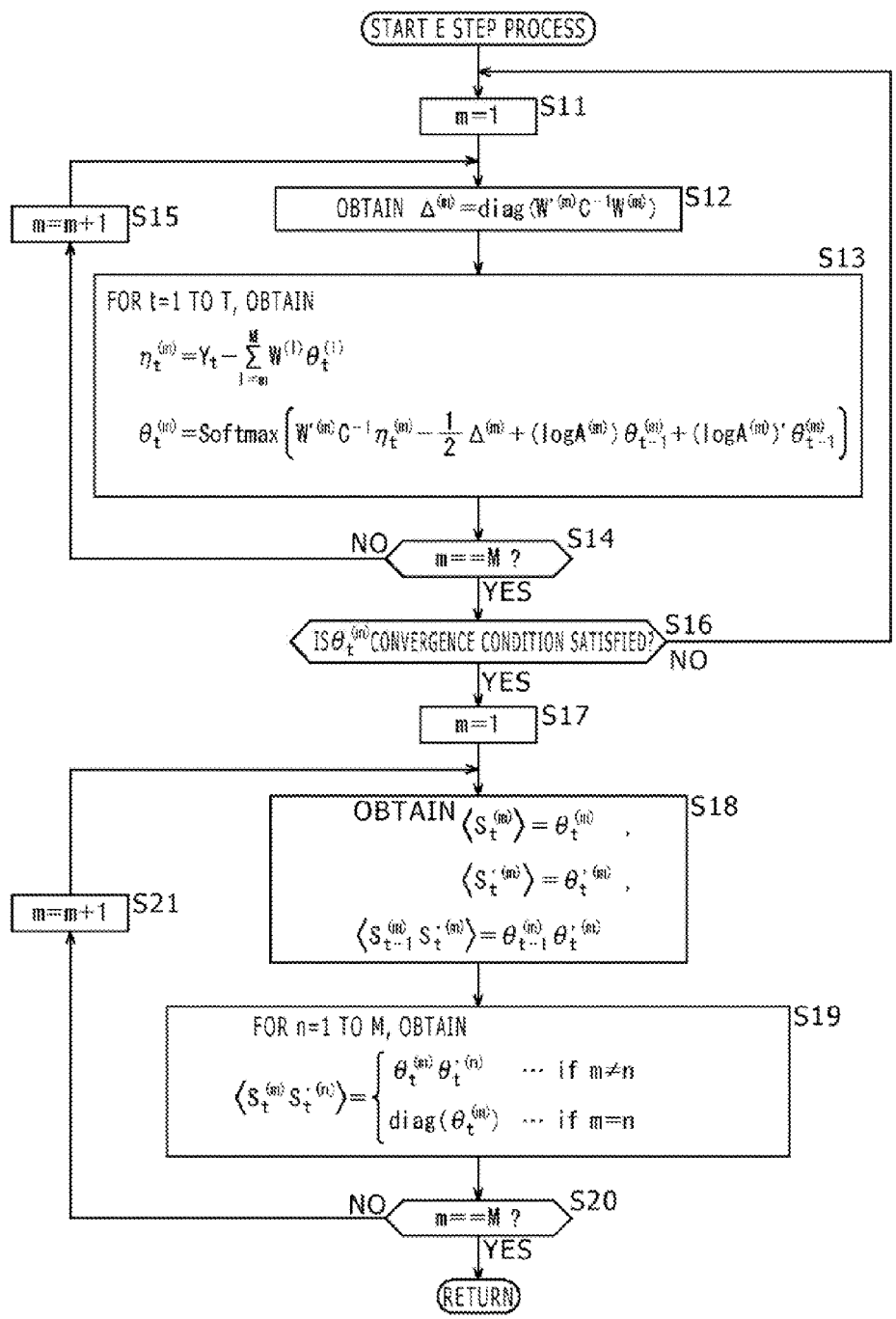
FIG. 11 is a flowchart of assistance in explaining details of an E step process in FIG. 10.

Details of the E step process performed as step S2 in FIG. 10 will next be described with reference to a flowchart of FIG. 11.

In step S11 of the E step process, the parameter estimating section 22 first assigns one to a variable m corresponding to a factor.

In step S12, the parameter estimating section 22 obtains a temporary variable $\Delta^{(m)}$ by the following Equation (5).

$$\Delta^{(m)} \mathrm{diag}(W^{(m)} C^{-1} W^{(m)}) \quad (5)$$

diag(·) in Equation (5) is a function for extracting diagonal elements of a matrix in (·) as a vector.

In step S13, the parameter estimating section 22 obtains a temporary variable $\eta_t^{(m)}$ and a variational parameter $\theta^{(m)}$ for all times t (t=1, ..., T) by Equation (6) and Equation (7).

$$\eta_t^{(m)} = Y_t - \sum_{l \neq m}^{M} W^{(l)} \theta_t^{(l)} \quad (6)$$

$$\theta_t^{(m)} = \mathrm{Softmax}\left(W'^{(m)} C^{-1} \eta_t^{(m)} - \frac{1}{2}\Delta^{(m)} + (\log A^{(m)})\theta_{t-1}^{(m)} + (\log A^{(m)})' \theta_{t-1}^{(m)}\right) \quad (7)$$

A summation (Σ) in Equation (6) denotes a sum when l is set to be 1 to M except m. In addition, a Softmax function in Equation (7) is a function for performing a process expressed by Equation (8).

$$\mathrm{Softmax}(q_i) = \frac{\exp(q_i)}{\sum_j \exp(q_j)} \quad (8)$$

In step S14, the parameter estimating section 22 determines whether the variable m is equal to the number M of state variables, that is, whether the variational parameter $\theta^{(m)}$ has been obtained for all the factors 1 to M. When it is determined in step S14 that the variable m is not equal to the number M of state variables, the process proceeds to step S15, where the parameter estimating section 22 increments the variable m by one. The parameter estimating section 22 then returns the process to step S12. Thereby, the process of steps S12 to S14 is repeated for the variable m after being updated.

When it is determined in step S14 that the variable m is equal to the number M of state variables, that is, that the variational parameter $\theta^{(m)}$ has been obtained for all the factors 1 to M, on the other hand, the process proceeds to step S16, where the parameter estimating section 22 determines whether a condition for convergence of the variational parameter $\theta^{(m)}$ is satisfied. It is determined in step S16 that the condition for convergence of the variational parameter $\theta^{(m)}$ is satisfied when the number of repetitions has reached a predetermined number of times set in advance, for example.

When it is determined in step S16 that the condition for convergence of the variational parameter $\theta^{(m)}$ is not satisfied, the process returns to step S11. Then, steps S11 to S16 are performed again, and thereby the variational parameter $\theta^{(m)}$ is calculated (updated) again.

When it is determined in step S16 that the condition for convergence of the variational parameter $\theta^{(m)}$ is satisfied, on the other hand, the process proceeds to step S17, where the parameter estimating section 22 assigns one to the variable m corresponding to a factor again.

Then, in step S18, the parameter estimating section 22 obtains expectation variables $<S_t^{(m)}>$, $<S'_t^{(m)}>$, and $<S_{t-1}^{(m)} S'_t^{(m)}>$ by the following Equations (9) to (11).

$$\langle S_t^{(m)} \rangle \theta_t^{(m)} \quad (9)$$

$$\langle S'_t^{(m)} \rangle \theta'_t^{(m)} \quad (10)$$

$$\langle S_{t-1}^{(m)} S'_t^{(m)} \rangle = \theta_{t-1}^{(m)} \theta'_t^{(m)} \quad (11)$$

Further, in step S19, the parameter estimating section 22 obtains an expectation variable $<S_t^{(m)} S_t^{(n)}>$ with a variable n set to 1 to M by the following Equation (12).

$$\langle S_t^{(m)} S_t^{\prime(n)} \rangle = \begin{cases} \theta_t^{(m)} \theta_t^{\prime(n)} & \ldots \text{ if } m \neq n \\ \mathrm{diag}(\theta_t^{(m)}) & \ldots \text{ if } m = n \end{cases} \quad (12)$$

In step S20, the parameter estimating section 22 determines whether the variable m is equal to the number M of state variables, that is, whether the expectation variables $<S_t^{(m)}>$, $<S'_t^{(m)}>$, $<S_{t-1}^{(m)} S'_t^{(m)}>$, and $<S_t^{(m)} S_t^{(n)}>$ have been obtained for all the factors 1 to M.

When it is determined in step S20 that the variable m is not equal to the number M of state variables, the process proceeds to step S21, where the parameter estimating section 22 increments the variable m by one. The parameter estimating section 22 then returns the process to step S18. Thereby, the process of steps S18 to S20 is repeated for the variable m after being updated.

When it is determined in step S20 that the variable m is equal to the number M of state variables, that is, that the expectation variables $<S_t^{(m)}>$, $<S'^{(m)}_t>$, $<S_{t-1}^{(m)}S'^{(m)}_t>$, and $<S_t^{(m)}S'^{(m)}_t>$ have been obtained for all the factors 1 to M, on the other hand, the E step process is ended.

Detailed Flowchart of M Step Process

Figure 12:
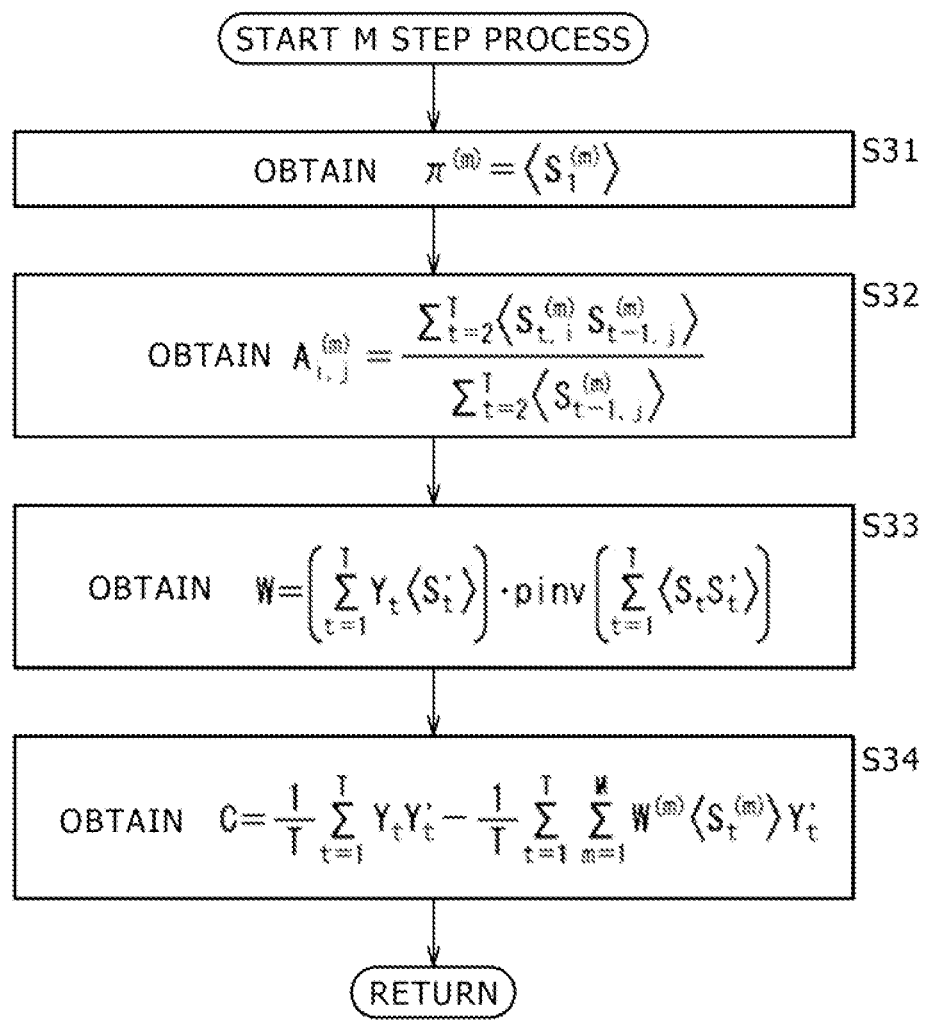
FIG. 12 is a flowchart of assistance in explaining details of an M step process in FIG. 10.

After the E step process is ended, the M step process in step S3 in FIG. 10 is performed. FIG. 12 is a flowchart of assistance in explaining details of the M step process in step S3.

In step S31 of the M step process, the parameter estimating section 22 obtains initial state probability $\pi^{(m)}$ for all the factors m=1 to M by the following Equation (13).

$$\pi^{(m)} = \langle S^{(m)} \rangle \tag{13}$$

In step S32, the parameter estimating section 22 obtains state transition probability $A_{i,j}^{(m)}$ from a state $S_i^{(m)}$ to a state $S_j^{(m)}$ for all the factors m by the following Equation (14).

$$A_{i,j}^{(m)} = \frac{\sum_{t=2}^{T} \langle S_{t,i}^{(m)} S_{t-1,j}^{(m)} \rangle}{\sum_{t=2}^{T} \langle S_{t-1,j}^{(m)} \rangle} \tag{14}$$

where $S_{t-1,j}^{(m)}$ denotes that a state $S_j^{(m)}$ before a transition is a state variable $S_{t-1}^{(m)}$ at time t−1, and $S_{t,i}^{(m)}$ denotes that a state $S_i^{(m)}$ after the transition is a state variable $S_t^{(m)}$ at time t.

In step S33, the parameter estimating section 22 obtains an observation probability parameter W by the following Equation (15).

$$W = \left( \sum_{t=1}^{T} Y_t \langle S'_t \rangle \right) \cdot pinv\left( \sum_{t=1}^{T} \langle S_t S'_t \rangle \right) \tag{15}$$

In Equation (15), the observation probability parameter W represents a matrix of D rows and MK columns (D×MK, where MK is a product of M and K) obtained by connecting M parameters $W^{(m)}$ of D rows and K columns (D×K) for all the factors in a column direction. Thus, the observation probability parameter $W^{(m)}$ of the factor m is obtained by decomposing the observation probability parameter W in the column direction. In addition, pinv(·) in Equation (15) is a function for obtaining a pseudo-inverse matrix.

In step S34, the parameter estimating section 22 obtains a covariance matrix C by the following Equation (16).

$$C = \frac{1}{T}\sum_{t=1}^{T} Y_t Y'_t - \frac{1}{T}\sum_{t=1}^{T}\sum_{m=1}^{M} W^{(m)} \langle S_t^{(m)} \rangle Y'_t \tag{16}$$

The model parameter Φ of the factorial HMM is obtained (updated) by the above-described steps S31 to S34, and the M step process is ended to proceed with the process of step S4 in FIG. 10.

Parameter Estimating Process by Structured Variational Method

Figure 13:
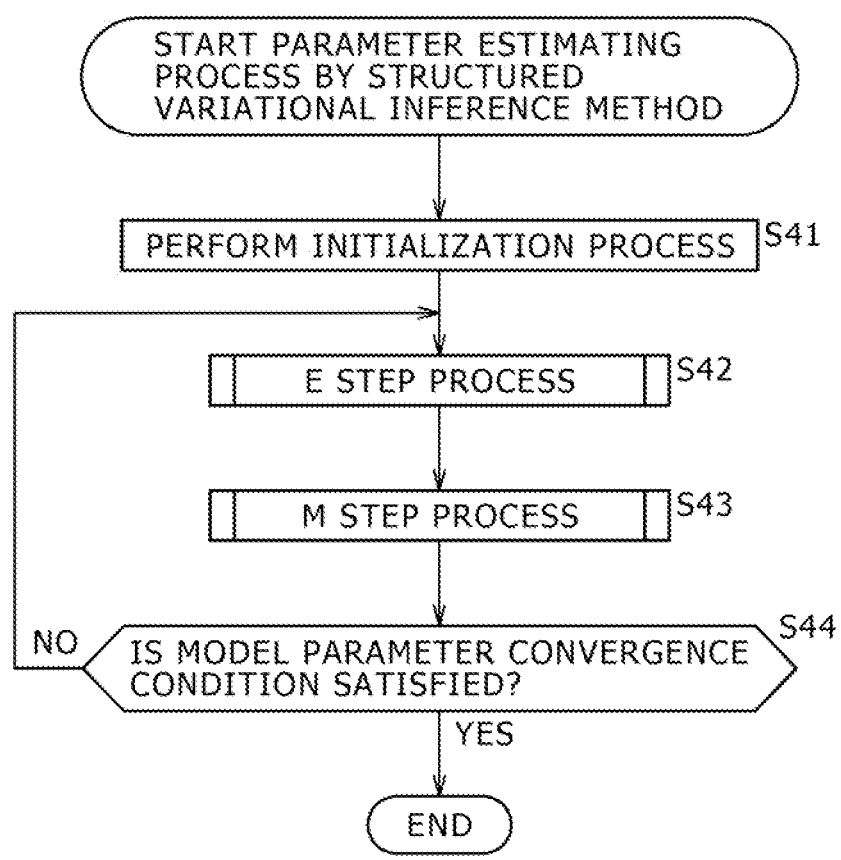
FIG. 13 is a flowchart of assistance in explaining a parameter estimating process by a structured variational method.

Description will next be made of a parameter estimating process by a structured variational method, which is "4) structured variational inference." FIG. 13 is a flowchart of a parameter estimating process by a structured variational method.

First, in step S41, the parameter estimating section 22 performs an initializing process for initializing working variables and the like in the parameter estimating process. Specifically, for all times t and factors m (t=1, ..., T, m=1, ..., M), the parameter estimating section 22 initializes a variational parameter $h_t^{(m)}$, an expectation variable $<S_t^{(m)}>$, the observation probability parameter $W^{(m)}$ of the factor m, a covariance matrix C, and state transition probability $A_{i,j}^{(m)}$. The variational parameter $h_t^{(m)}$ is assigned 1/K as an initial value. The parameters other than the variational parameter $h_t^{(m)}$ are assigned similar values to those of the initializing process of step S1 described above.

The processes of following steps S42 to S44 are similar to those of steps S2 to S4, respectively, in FIG. 10, and therefore description thereof will be omitted.

Detailed Flowchart of E Step Process

Figure 14:
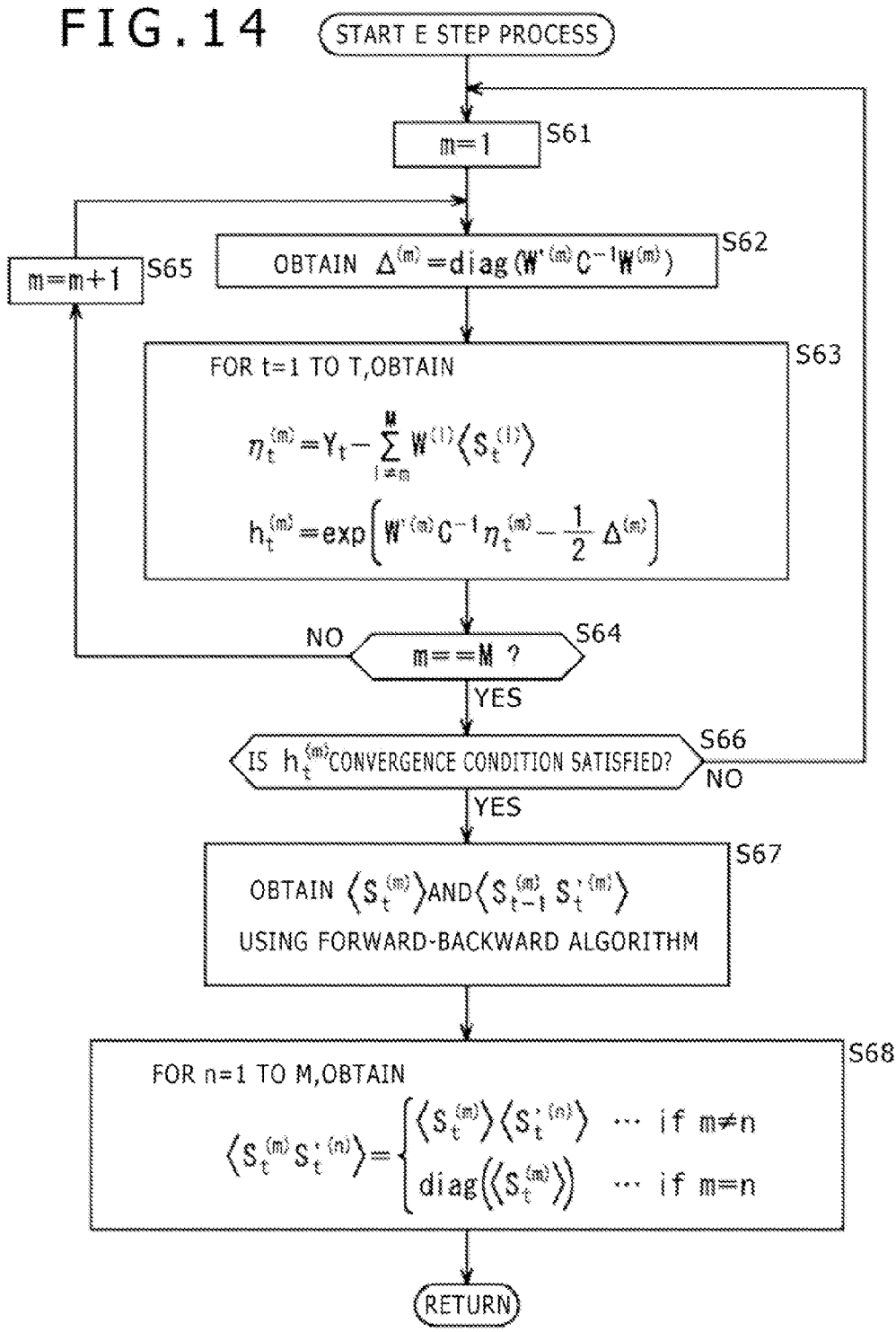
FIG. 14 is a flowchart of assistance in explaining details of an E step process in FIG. 13.

Details of the E step process performed as step S42 in FIG. 13 will next be described with reference to a flowchart of FIG. 14.

In step S61 of the E step process in the parameter estimating process by the structured variational method, the parameter estimating section 22 first assigns one to a variable m corresponding to a factor.

Then, in step S62, the parameter estimating section 22 obtains a temporary variable $\Delta^{(m)}$ by the above-described Equation (5). That is, the processes of steps S61 and S62 are similar to the above-described steps S11 and S12 in FIG. 11.

In step S63, the parameter estimating section 22 obtains a temporary variable $\eta_t^{(m)}$ and a variational parameter $h_t^{(m)}$ for all times t (t=1, ..., T) by Equation (17) and Equation (18).

$$\eta_t^{(m)} = Y_t - \sum_{l \ne m}^{M} W^{(l)} \langle S_t^{(l)} \rangle \tag{17}$$

$$h_t^{(m)} = \exp\left( W'^{(m)} C^{-1} \eta_t^{(m)} - \frac{1}{2}\Delta^{(m)} \right) \tag{18}$$

In step S64, the parameter estimating section 22 determines whether the variable m is equal to the number M of state variables, that is, whether the variational parameter $h_t^{(m)}$ has been obtained for all the factors 1 to M. When it is determined in step S64 that the variable m is not equal to the number M of state variables, the process proceeds to step S65, where the parameter estimating section 22 increments the variable m by one. The parameter estimating section 22 then returns the process to step S62. Thereby, the process of steps S62 to S64 is repeated for the variable m after being updated.

When it is determined in step S64 that the variable m is equal to the number M of state variables, that is, that the variational parameter $h_t^{(m)}$ has been obtained for all the factors 1 to M, on the other hand, the process proceeds to step S66, where the parameter estimating section 22 determines whether a condition for convergence of the variational parameter $h_t^{(m)}$ is satisfied. The parameter estimating section 22 determines in step S66 that the condition for convergence of the variational parameter $h_t^{(m)}$ is satisfied when the number of repetitions has reached a predetermined number of times set in advance, for example.

When it is determined in step S66 that the condition for convergence of the variational parameter $h_t^{(m)}$ is not satisfied, the process returns to step S61. Then, steps S61 to S66 are performed again, and thereby the variational parameter $h_t^{(m)}$ is calculated (updated) again.

When it is determined in step S66 that the condition for convergence of the variational parameter $h_t^{(m)}$ is satisfied, on the other hand, the process proceeds to step S67, where the parameter estimating section 22 obtains expectation variables $<S_t^{(m)}>$ and $<S_{t-1}^{(m)}S'^{(m)}_t>$ using a forward-backward algorithm using the variational parameter $h_t^{(m)}$ and the state transition probability $A_{i,j}^{(m)}$.

In step S68, the parameter estimating section 22 obtains an expectation variable $<S_t^{(m)}S'^{(n)}_t>$ with a variable n set to 1 to M by the following Equation (19). Then, the parameter estimating section 22 ends the E step process, and returns to FIG. 13.

$$\langle S_t^{(m)} S_t'^{(n)} \rangle = \begin{cases} \langle S_t^{(m)} \rangle \langle S_t'^{(n)} \rangle & \dots \text{if } m \neq n \\ diag(\langle S_t^{(m)} \rangle) & \dots \text{if } m = n \end{cases} \quad (19)$$

The M step process performed after the E step process in the parameter estimating process by the structured variational method is similar to the M step process in the parameter estimating process by the completely factorized variational method, which M step process has been described with reference to FIG. 12, and therefore description thereof will be omitted.

Method of Factorial HMM by Parameter Estimating Section 22

The parameter estimating process by the completely factorized variational method and the parameter estimating process by the structured variational method among the four estimating methods for obtaining the model parameter Φ of the factorial HMM disclosed in Document X have been described above.

The factorial HMM itself is a general-purpose time series data modeling method, and is applicable to various problems other than NILM. However, because the factorial HMM is a general-purpose model, the following two problems occur when the factorial HMM is applied to NILM as it is.

1) There is a factor with "negative power consumption," which cannot physically exist. This corresponds to a fact that the parameter $W^{(m)}$ of the factorial HMM can assume even a negative value because a degree of freedom of parameters of the factorial HMM is too high.

2) The factors and the electric apparatuses 12 installed in the house may not be in one-to-one correspondence. In other words, there is a case where one electric apparatus 12 corresponds to a plurality of factors. This is because one piece of observation data can be explained in two or more ways due to high power of expression of the factorial HMM.

Accordingly, the parameter estimating section 22 in the electric apparatus estimating device 1 to which the present technology is applied adopts a method obtained by making the following improvements to the factorial HMM disclosed in Document X serving as a basis so that the factorial HMM is applied to NILM.

First, as an improvement in the factorial HMM, the parameter estimating section 22 adds a constraint such that the observation probability parameter W(m) in the factorial HMM is a nonnegative matrix (nonnegative constraint). Because alternating-current power is supplied, the current value as observation data Y assumes a positive value and a negative value alternately. Accordingly, the parameter estimating section 22 converts the current value as observation data Y into only positive values by performing one of the following methods as preprocessing. Specifically, 1) the parameter estimating section 22 uses the absolute value of the current value as observation data Y, 2) the parameter estimating section 22 uses only a part corresponding to half a cycle in which positive values are taken as observation data Y, or 3) the parameter estimating section 22 uses a power value (product of the current value and a voltage value) as observation data Y.

Further, the parameter estimating section 22 obtains an observation probability parameter W minimizing an objective function expressed by the following Equation (20) by constrained quadratic programming without using the above-described Equation (15).

$$\min \|F \cdot W^{vertical} - g\|^2 \quad (20)$$

where $W^{vertical} \geq 0$, $$F = \underbrace{\begin{bmatrix} \sum_{t=1}^{T} \langle S_t S_t' \rangle & & & 0 \\ & \sum_{t=1}^{T} \langle S_t S_t' \rangle & & \\ & & \ddots & \\ 0 & & & \sum_{t=1}^{T} \langle S_t S_t' \rangle \end{bmatrix}}_{D},$$

$$g = \text{reshape\_to\_vertical\_vector}\left(\sum_{t=1}^{T} Y_t \langle S_t' \rangle\right)$$

Specifically, in place of the above-described Equation (15), the parameter estimating section 22 obtains $W^{vertical}$ that minimizes the square of the absolute value of a difference between a product vector of F and $W^{vertical}$ and a g-vector as an objective function under a constraint condition $W^{vertical} \geq 0$. Equation (20) means the obtainment of $W^{vertical}$ that minimizes an error between the pattern of a current waveform expressed by the parameter W(m) and the pattern of a total value of the above-described consumed current expressed by the observation data Y for all the factors of the factorial HMM. Incidentally, reshape_to_vertical_vector(·) is a function representing an operation of transforming for example a matrix of a rows and b columns (a×b) into a vector of ab rows and one column (ab×1, where ab is a product of a and b) by connecting the column elements of the matrix to each other vertically.

The parameter $W^{vertical}$ to be obtained has a relation $$W^{vertical} = \text{reshape\_to\_vertical\_vector}(W)$$

Thus, the observation probability parameter W is obtained by converting $W^{vertical}$ of ab rows and one column obtained by Equation (20) into a rows and b columns.

Fortran code nnls.f implemented on the basis of a document "Lawson, C. L. and R. J. Hanson, Solving Least Squares Problems, Prentice-Hall, 1974, Chapter 23." and nnls.c as a C-language version thereof are widely known for performance of the optimization process of Equation (20). In addition, Matlab (registered trademark), Python (registered trademark) and the like also provide a tool for easily performing the optimization process of Equation (20).

Second, as an improvement in the factorial HMM, the parameter estimating section 22 fixes the number of states K to two (K=2) corresponding to only an on state and an off state, and sets one of a first column and a second column of the observation probability parameter W to a zero vector at all times. This assumes that the electric apparatuses 12 assume only two states, that is, an on state and an off state, and that a power consumption in the off state is zero at all times.

The constraint condition of the two on and off states has advantages in that a result of parameter estimation of the factorial HMM corresponds to actual modes of operation of the electric apparatuses 12 and that the stability of parameter learning of the factorial HMM is improved. Some simple electric apparatuses 12 such as an incandescent lamp and the like completely satisfy the constraint condition of the two on and off states. Even in a case of electric apparatuses 12 having a plurality of modes of operation, a result of parameter estimation of the factorial HMM better corresponds to actual modes of operation of the electric apparatuses 12. One of reasons that a result of parameter estimation of the factorial HMM does not correspond to actual modes of operation of the electric apparatuses when this constraint condition is not added is the occurrence of a number of local solutions that do not correspond in actuality but have high likelihood because the factorial HMM is a method having a very high power of expression.

M Step Process by Parameter Estimating Section 22

Figure 15:
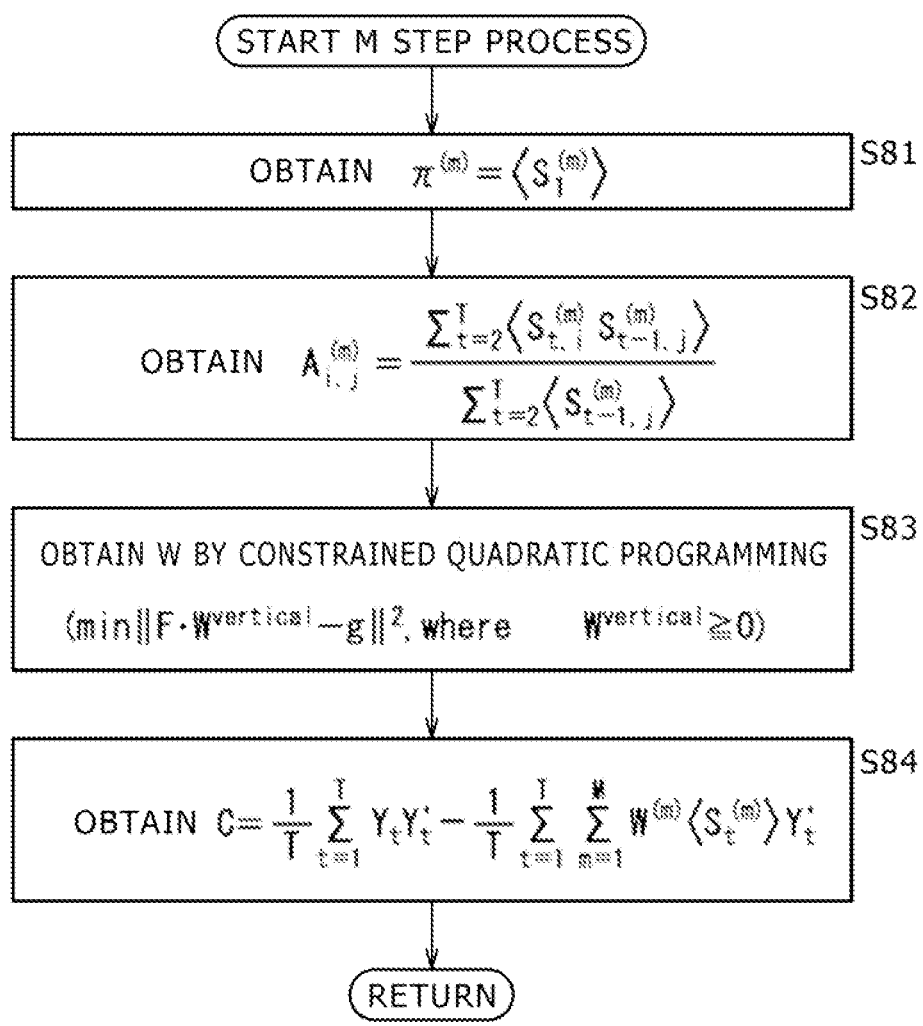
FIG. 15 is a flowchart of assistance in explaining an M step process by a parameter estimating section.

An M step process by the parameter estimating section 22 will be described with reference to FIG. 15.

Incidentally, processes other than the M step process are similar to the processes described with reference to FIG. 10 and FIG. 11, FIG. 13 and FIG. 14, and the like. However, there are differences in that observation data Y stored in the time series retaining section 44 is converted into only positive values, and in that the number K of states of the parameter $W^{(m)}$ is two (K=2) and one of a first column and a second column of the parameter $W^{(m)}$ is a zero vector at all times.

In step S81 of the M step process, the parameter estimating section 22 obtains initial state probability $\pi^{(m)}$ for all the factors m=1 to M by the above-described Equation (13).

In step S82, the parameter estimating section 22 obtains state transition probability $A_{i,j}^{(m)}$ from a state $S_j^{(m)}$ to a state $S_i^{(m)}$ for all the factors m by the above-described Equation (14).

In step S83, the parameter estimating section 22 obtains an observation probability parameter W by the constrained quadratic programming of Equation (20) without using the above-described Equation (15).

In step S84, the parameter estimating section 22 obtains a covariance matrix C by the above-described Equation (16).

The M step process is performed by the parameter estimating section 22 through the above processes.

Process of Identical Apparatus Determining Section 24

A process of the identical apparatus determining section 24 will next be described.

Figure 16:
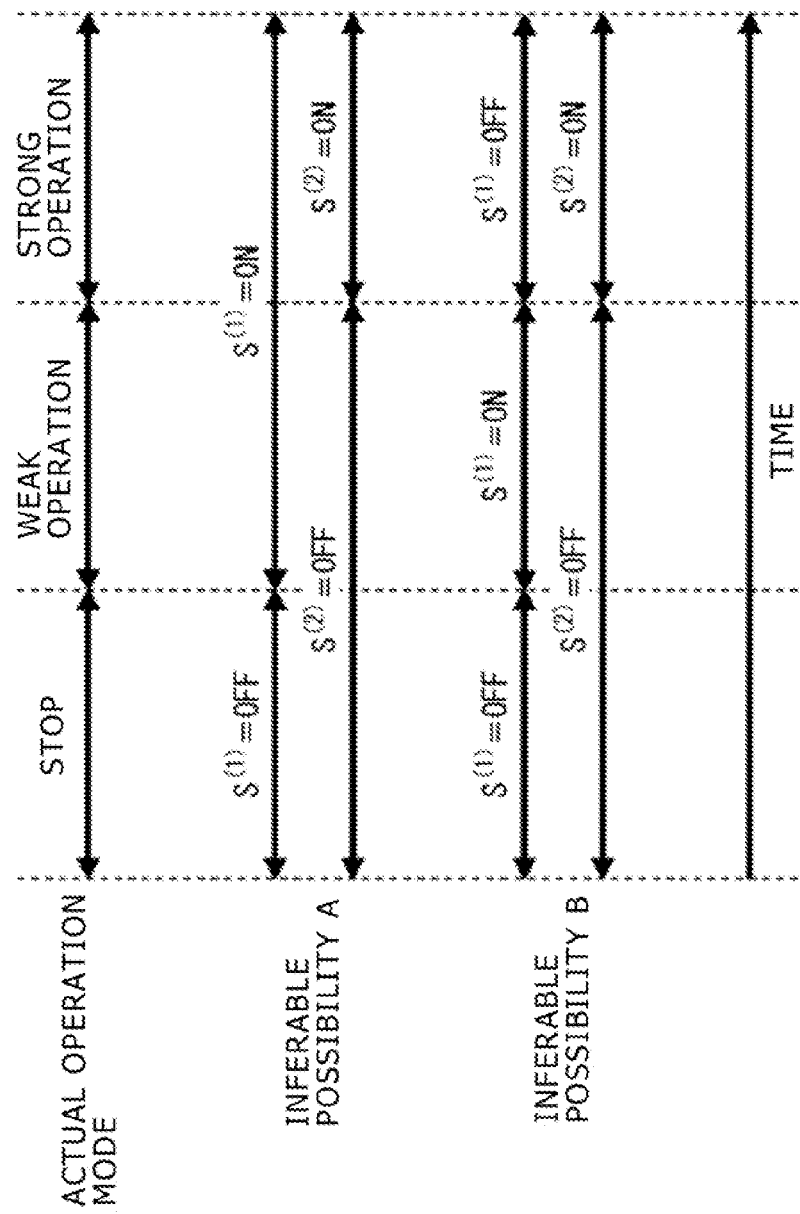
FIG. 16 is a diagram showing results of parameter estimation for an electric apparatus whose original number K of states is three.

FIG. 16 shows results of parameter estimation when an electric apparatus 12 whose original number K of states is three (K=3), for example an electric fan having three modes of operation, that is, a stop mode, a weak operation mode, and a strong operation mode, is estimated under the constraint condition of two on and off states.

When the electric apparatus 12 whose original number K of states is three (K=3) is estimated under the constraint condition of two on and off states, the results of parameter estimation converge to a possibility A or a possibility B in FIG. 16.

In FIG. 16, a first state and a second state as estimation results when estimated as the two on and off states are described as "ON" and "OFF" to facilitate understanding. In practice, for example, supposing that the first state is OFF, and that the second state is ON, $S_t^{(m)}$=[First State, Second State]= [0.0, 1.0] at a time of ON, or $S_t^{(m)}$=[First State, Second State]=[0.9, 0.1] at a time of OFF.

The possibility A represents the strong operation as a simultaneous occurrence of two factors. The possibility B represents the weak operation and the strong operation by two factors separately.

The possibility A and the possibility B each model states of operation of the electric fan correctly, but do not show, as they are, whether the two factors represent two separate electric apparatuses 12 or different modes of one electric apparatus 12. However, it is known that the following conditions hold at all times in the case of one electric apparatus 12.

Possibility A:

Necessary condition: When $S^{(2)}$=ON, $S^{(1)}$=ON at all times.

Hint condition: When a transition is made from $S^{(1)}$=ON to $S^{(1)}$=OFF, a transition may be made from $S^{(2)}$=ON to $S^{(2)}$=OFF at the same time.

Hint condition: When a transition is made from $S^{(1)}$=OFF to $S^{(1)}$=ON, a transition may be made from $S^{(2)}$=OFF to $S^{(2)}$=ON at the same time.

Possibility B:

Necessary condition: When $S^{(1)}$=ON, $S^{(2)}$=OFF at all times.

Necessary condition: When $S^{(2)}$=ON, $S^{(1)}$=OFF at all times.

Hint condition: When a transition is made from $S^{(1)}$=ON to $S^{(1)}$=OFF, a transition may be made from $S^{(2)}$=OFF to $S^{(2)}$=ON at the same time.

Hint condition: When a transition is made from $S^{(1)}$=OFF to $S^{(1)}$=ON, a transition may be made from $S^{(2)}$=ON to $S^{(2)}$=OFF at the same time.

Thus, by evaluating the conditions, it is possible to estimate that the state $S^{(1)}$ and the state $S^{(2)}$ originate in an identical electric apparatus 12.

Figure 17:
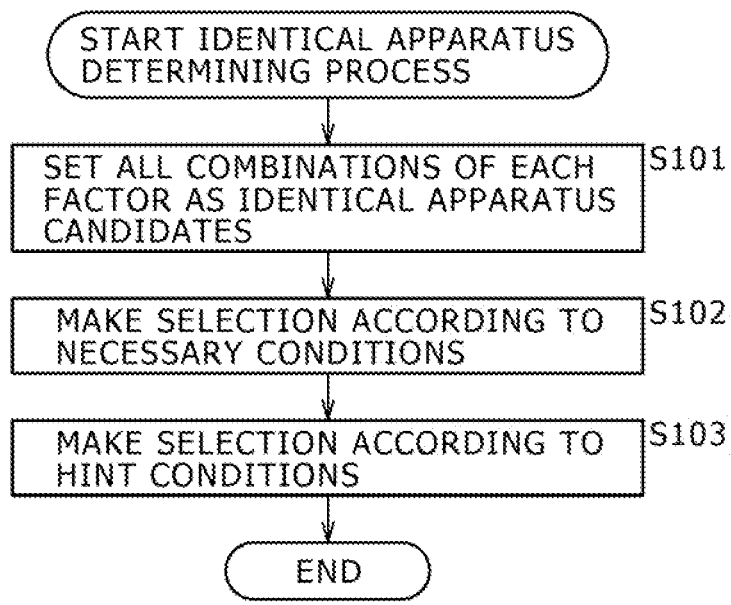
FIG. 17 is a flowchart of assistance in explaining an identical apparatus determining process by an identical apparatus determining section.

FIG. 17 is a flowchart of an identical apparatus determining process by the identical apparatus determining section 24.

First, in step S101, the identical apparatus determining section 24 generates all combinations of each factor of the factorial HMM as identical apparatus candidates.

In step S102, the identical apparatus determining section 24 selects identical apparatus candidates according to necessary conditions. Specifically, the identical apparatus determining section 24 selects combinations that satisfy a necessary condition at all times among all the combinations of each factor as identical apparatus candidates.

In step S103, the identical apparatus determining section 24 selects identical apparatus candidates according to hint conditions. Specifically, the identical apparatus determining section 24 determines that a combination that has satisfied a hint condition Z times or more (Z is an integer of two or more) among the combinations selected in step S102 is factors of an identical apparatus. The identical apparatus determining section 24 stores information on the factors determined to be the factors of the identical apparatus in the database 23, and then ends the process.

General Process of Electric Apparatus Estimating Device 1

Figure 18:
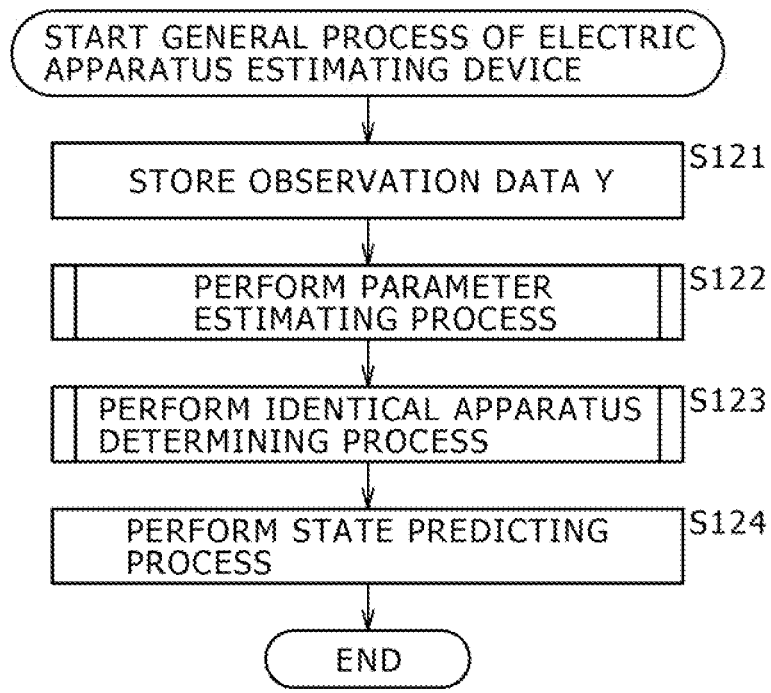
FIG. 18 is a flowchart of assistance in explaining a process of the whole of the electric apparatus estimating device in FIG. 5.

A general process of the electric apparatus estimating device 1 will be described with reference to a flowchart of FIG. 18.

First, in step S121, the sensor section 21 measures a total value of current consumed within the house as observation data Y, subjects the obtained total value to preprocessing that converts the total value into only a positive value, and then stores the resulting value in the time series retaining section 44.

In step S122, the parameter estimating section 22 performs a parameter estimating process for estimating the model parameter of the factorial HMM on the basis of observation data $\{Y_1, Y_2, Y_3, \ldots, Y_t, \ldots, Y_T\}$. Then, the model parameter (value of the model parameter) as a result of the estimation is stored in the database 23.

The parameter estimating process by the completely factorized variational method in FIG. 10 or the parameter estimating process by the structured variational method in FIG. 13, for example, is performed as the parameter estimating process in step S122. However, the M step process in FIG. 15 is performed as the M step process of step S3 in FIG. 10 or step S43 in FIG. 13.

In step S123, the identical apparatus determining section 24 performs the identical apparatus determining process described with reference to FIG. 17.

In step S124, the state predicting section 25 performs a predicting process of predicting the state of the factor m in the future after passage of a predetermined time from a present time. Specifically, the state predicting section 25 obtains the state probability $S_{T+L}^{(m)}$ of the factor m at time T+L, which state probability indicates the state of the factor m at a future time T+L after passage of a predetermined time L from a present time T, by the following Equation (21).

$$S_{T+L}^{(m)} = \prod_{l=1}^{L} P(S_T^{(m)} \mid S_{T-1}^{(m)}) \cdot S_T^{(m)} \quad (21)$$

The state predicting section 25 outputs a result of the prediction to a related apparatus controlling section not shown in the figures, for example, and then ends the process.

According to the electric apparatus estimating process of the electric apparatus estimating device 1 described above, observation data Y formed by a total value of current consumed by the plurality of electric apparatuses 12 installed in the respective places within the house is modeled by the factorial HMM, and a model parameter is obtained. This factorial HMM is an improvement on the factorial HMM in the past for application to NILM. Specifically, the electric apparatus estimating device 1 converts the observation probability parameter $W^{(m)}$ into a nonnegative value, and obtains the observation probability parameter $W^{(m)}$ by constrained quadratic programming. In addition, the electric apparatus estimating device 1 fixes the number of states K of state variables $S^{(1)}$ to $S^{(M)}$ to two (K=2) corresponding to only an on state and an off state, and sets one of a first column and a second column of the observation probability parameter W to a zero vector at all times. In other words, under constraint conditions that the number of states assumable by each state of the factorial HMM be two, that the observation probability parameter $W^{(m)}$ corresponding to the pattern of a current waveform of the factor m of the factorial HMM be nonnegative, and that one of the first column and the second column corresponding to the number of states be zero at all times, a likelihood function as a degree of the factorial HMM describing the pattern of a total value of consumed current indicated by time series data is maximized, whereby the observation probability parameter $W^{(m)}$ as a model parameter is obtained. Thereby, a need for an advance database is eliminated, and the model parameter of the factorial HMM can be obtained easily. That is, a method can be established which facilitates the calculation and adjustment of the parameter and which eliminates a need for an advance database.

The series of processes described above can be carried out not only by hardware but also by software. When the series of processes is to be carried out by software, a program constituting the software is installed onto a computer. The computer includes a computer incorporated in dedicated hardware or for example a general-purpose personal computer that can perform various functions by installing various programs thereon.

FIG. 19 is a block diagram showing an example of hardware configuration of a computer performing the series of processes described above by a program.

In the computer, a CPU (Central Processing Unit) 101, a ROM (Read Only Memory) 102, and a RAM (Random Access Memory) 103 are interconnected by a bus 104.

The bus 104 is further connected with an input-output interface 105. The input-output interface 105 is connected with an input section 106, an output section 107, a storage section 108, a communicating section 109, and a drive 110.

The input section 106 is formed by a keyboard, a mouse, a microphone and the like. The output section 107 is formed by a display, a speaker and the like. The storage section 108 is formed by a hard disk, a nonvolatile memory and the like. The communicating section 109 is formed by a network interface and the like. The drive 110 drives a removable recording medium 111 such as a magnetic disk, an optical disk, a magneto-optical disk, a semiconductor memory or the like.

In the computer configured as described above, the CPU 101 for example loads a program stored in the storage section 108 into the RAM 103 via the input-output interface 105 and the bus 104, and then executes the program. Thereby the series of processes described above is performed.

The program executed by the computer (CPU 101) is for example provided in a state of being recorded on the removable recording medium 111 as a packaged medium or the like. In addition, the program can be provided via a wired or wireless transmission medium such as a local area network, the Internet, digital satellite broadcasting or the like.

In the computer, the program can be installed into the storage section 108 via the input-output interface 105 by loading the removable recording medium 111 into the drive 110. In addition, the program can be received by the communicating section 109 via a wired or wireless transmission medium and installed into the storage section 108. Further, the program can be installed in the ROM 102 or the storage section 108 in advance.

It is to be noted that in the present specification, the steps described in the flowcharts may be not only performed in time series in the described order but also performed in parallel or in necessary timing such as at a time of a call being made, for example, without being necessarily performed in time series.

In addition, in the present specification, a system refers to an apparatus as a whole formed by a plurality of devices.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A electrical apparatus estimating device comprising:
a data obtaining section including at least a voltmeter and an ammeter configured to obtain time series data on a total value of current consumed by a plurality of electric apparatuses, wherein the voltmeter and the ammeter are located on a secondary side of a distribution board; and
a microprocessor including a parameter estimating section configured to:
obtain a model parameter when states of operation of said plurality of electric apparatuses are modeled by a stochastic model on a basis of the obtained time series data, wherein in a parameter estimating process based on an algorithm which alternately calculates expectation and maximizes likelihood, under constraint conditions that converted values or a vector of an observation parameter W(m) corresponding to a pattern of a current waveform of a factor m of said stochastic model are nonnegative, said stochastic model maximizes a likelihood function as a degree of said stochastic model describing a pattern of the total value of said consumed current indicated by said time series data, whereby said parameter estimating section obtains the observation parameter W(m) as said model parameter, and adjust the model parameter, when new time series data is obtained, to minimize an error between said pattern of the current waveform of said factor m and said pattern of the total value of said consumed current indicated by said time series data for all factors; and a state predicting section predicting a state of said factor at a future time after passage of a predetermined time from a present time; and a controlling section controlling at least one electric apparatus of the plurality of electric apparatuses, which are located on the secondary side of the distribution board, based on a result, from the state predicting section, of a prediction of the state of said factor at the future time.

2. The electrical apparatus estimating device according to claim 1, wherein said stochastic model is Factorial HMM.

3. The electrical apparatus estimating device according to claim 2, in said parameter estimating process based on said algorithm, under constraint conditions that a number of states assumable by each state of said factorial HMM is two, said Factorial HMM maximizes said likelihood function as a degree of said factorial HMM describing said pattern of the total value of said consumed current indicated by said time series data.

4. The electrical apparatus estimating device according to claim 2, wherein in said parameter estimating process based on said algorithm, under constraint conditions that one of a first column and a second column corresponding to said number of states is zero at all times, said Factorial HMM maximizes said likelihood function as a degree of said factorial HMM describing said pattern of the total value of said consumed current indicated by said time series data.

5. The electrical apparatus estimating device according to claim 2, further comprising an identical apparatus determining section determining that a plurality of predetermined factors of said factorial HMM correspond to said time series data.

6. The electrical apparatus estimating device according to claim 5, wherein said identical apparatus determining section selects combinations that satisfy a necessary condition at all times among all combinations of each factor of said factorial HMM as identical apparatus candidates, and determines that a combination that has satisfied a hint condition a predetermined number of times among the selected identical apparatus candidates corresponds to said time series data, whereby said identical apparatus determining section determines that the plurality of predetermined factors correspond to said time series data.

7. The electrical apparatus estimating device according to claim 1, wherein said data obtaining section obtains a total value of current consumed by said plurality of electric apparatuses in predetermined cycles in synchronism with a phase of voltage supplied to said electric apparatuses.

8. The electrical apparatus estimating device according to claim 1, further comprising an electrical apparatus identifying section identifying plurality of electrical apparatuses.

9. The electrical apparatus estimating device according to claim 8, further comprising a displaying unit displaying an operating state of said plurality electrical apparatuses identified by the electrical apparatus identifying section based on the result estimated by said parameter estimating section.

10. The electrical apparatus estimating device according to claim 1, wherein said data obtaining section obtains time series data on a total value of current consumed by a plurality of electric apparatuses on predetermined cycles synchronizing phase of supply voltage to said electrical apparatuses.

11. A non-transitory computer readable medium storing a computer program for making a system function as:

a data obtaining section including at least a voltmeter and an ammeter configured to obtain time series data on a total value of current consumed by a plurality of electric apparatuses, wherein the voltmeter and the ammeter are located on a secondary side of a distribution board; and a microprocessor including a parameter estimating section configured to:

obtain a model parameter when states of operation of said plurality of electric apparatuses are modeled by a stochastic model on a basis of the obtained time series data, wherein in a parameter estimating process based on an algorithm which alternately calculates expectation and maximizes likelihood, under constraint conditions that converted values or a vector of an observation parameter W(m) corresponding to a pattern of a current waveform of a factor m of said stochastic model are nonnegative, said stochastic model maximizes a likelihood function as a degree of said stochastic model describing a pattern of the total value of said consumed current indicated by said time series data, whereby said parameter estimating section obtains the observation parameter W(m) as said model parameter, and adjust the model parameter, when new time series data is obtained, to minimize an error between said pattern of the current waveform of said factor m and said pattern of the total value of said consumed current indicated by said time series data for all factors; and a state predicting section predicting a state of said factor at a future time after passage of a predetermined time from a present time; and a controlling section controlling at least one electric apparatus of the plurality of electric apparatuses, which are located on the secondary side of the distribution board, based on a result, from the state predicting section, of a prediction of the state of said factor at the future time.

* * * * *